(12) United States Patent
Bradford et al.

(10) Patent No.: US 10,493,723 B2
(45) Date of Patent: Dec. 3, 2019

(54) BRANCHED POLYORGANOSILOXANES AND RELATED CURABLE COMPOSITIONS, METHODS, USES, AND DEVICES

(71) Applicant: Dow Corning Corporation, Midland, MI (US)

(72) Inventors: Michael L. Bradford, Midland, MI (US); Arianne Edlai R. Tan, Pearland, TX (US); Yin Tang, Midland, MI (US); Afrooz A. Zarisfi, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 105 days.

(21) Appl. No.: 15/288,356

(22) Filed: Oct. 7, 2016

(65) Prior Publication Data

US 2017/0130108 A1    May 11, 2017

Related U.S. Application Data

(60) Provisional application No. 62/251,173, filed on Nov. 5, 2015.

(51) Int. Cl.
| | | |
|---|---|---|
| *C09J 183/04* | (2006.01) | |
| *B32B 7/12* | (2006.01) | |
| *C08G 77/20* | (2006.01) | |

(52) U.S. Cl.
CPC ............... *B32B 7/12* (2013.01); *C08G 77/20* (2013.01); *B32B 2255/26* (2013.01); *C09J 2203/326* (2013.01); *C09J 2483/00* (2013.01)

(58) Field of Classification Search
CPC .............................. C08G 77/12; C08G 77/20
See application file for complete search history.

(56) References Cited

U.S. PATENT DOCUMENTS

| | | | |
|---|---|---|---|
| 2,676,182 A | 4/1954 | Daudt et al. | |
| 3,159,601 A | 12/1964 | Ashby | |
| 3,220,972 A | 11/1965 | Lamoreaux | |
| 3,296,291 A | 1/1967 | Chalk et al. | |
| 3,419,593 A | 12/1968 | Willing | |
| 3,516,946 A | 6/1970 | Modic | |
| 3,714,109 A | 1/1973 | Matherly et al. | |
| 3,814,730 A | 6/1974 | Karstedt | |
| 3,989,668 A | 11/1976 | Lee et al. | |
| 4,087,585 A | 5/1978 | Schulz | |
| 4,143,088 A | 3/1979 | Favre et al. | |
| 4,279,717 A | 7/1981 | Eckberg et al. | |
| 4,322,844 A | 3/1982 | Fellinger et al. | |
| 4,348,454 A | 9/1982 | Eckberg | |
| 4,611,042 A | 9/1986 | Rivers-Farrell et al. | |
| 4,681,963 A | 7/1987 | Lewis | |
| 4,705,765 A | 11/1987 | Lewis | |
| 4,726,964 A | 2/1988 | Isobe et al. | |
| 4,737,562 A | 4/1988 | Chaudhury et al. | |
| 4,742,103 A | 5/1988 | Morita et al. | |
| 4,753,977 A | 6/1988 | Merrill | |
| 4,766,176 A | 8/1988 | Lee et al. | |
| 4,766,183 A | 8/1988 | Rizk et al. | |
| 4,774,310 A | 9/1988 | Butler | |
| 4,784,879 A | 11/1988 | Lee et al. | |
| 4,962,076 A | 10/1990 | Chu et al. | |
| 4,987,158 A | 1/1991 | Eckberg | |
| 5,017,654 A | 5/1991 | Togashi et al. | |
| 5,034,491 A | 7/1991 | Wewers et al. | |
| 5,036,117 A | 7/1991 | Chung et al. | |
| 5,051,455 A | 9/1991 | Chu et al. | |
| 5,053,422 A | 10/1991 | Pinza et al. | |
| 5,053,442 A | 10/1991 | Chu et al. | |
| 5,057,476 A | 10/1991 | Saruyama et al. | |
| 5,075,038 A | 12/1991 | Cole et al. | |
| 5,175,325 A | 12/1992 | Brown et al. | |
| 5,194,649 A | 3/1993 | Okawa | |
| 5,198,476 A | 3/1993 | Kobayashi et al. | |
| 5,200,543 A | 4/1993 | Inomata et al. | |
| 5,248,715 A | 9/1993 | Gray et al. | |
| 5,254,645 A | 10/1993 | King et al. | |
| 5,298,589 A | 3/1994 | Buese et al. | |
| 5,364,921 A | 11/1994 | Gray et al. | |
| 5,397,813 A | 3/1995 | Eckberg et al. | |
| 5,412,055 A | 5/1995 | Loo | |
| 5,459,206 A | 10/1995 | Somemiya et al. | |
| 5,473,026 A | 12/1995 | Strong et al. | |
| 5,525,696 A | 6/1996 | Herzig et al. | |
| 5,536,803 A | 7/1996 | Fujiki et al. | |
| 5,545,831 A | 8/1996 | Kaiya et al. | |
| 5,567,883 A | 10/1996 | Nara | |
| 5,580,925 A | 12/1996 | Iwahara et al. | |
| 5,691,435 A | 11/1997 | Herzig et al. | |
| 5,696,209 A | 12/1997 | King et al. | |
| 5,736,619 A | 4/1998 | Kane et al. | |
| 5,744,507 A | 4/1998 | Angell et al. | |
| 5,869,726 A | 2/1999 | Dauth et al. | |
| 5,985,462 A | 11/1999 | Herzig et al. | |
| 6,013,701 A | 1/2000 | Kunimatsu et al. | |
| 6,030,919 A | 2/2000 | Lewis | |
| 6,093,782 A | 7/2000 | Herzig et al. | |
| 6,127,502 A | 10/2000 | Krahnke et al. | |
| 6,160,150 A | 12/2000 | Krahnke et al. | |
| 6,169,142 B1 | 1/2001 | Nakano et al. | |
| 6,252,100 B1 | 6/2001 | Herzig | |
| 6,297,340 B1 | 10/2001 | Tachikawa | |
| 6,303,729 B1 | 10/2001 | Sato | |
| 6,313,255 B1 | 11/2001 | Rubinsztajn | |

(Continued)

FOREIGN PATENT DOCUMENTS

| | | |
|---|---|---|
| EP | 0347895 | 6/1986 |
| JP | 201184600 | 10/2009 |

(Continued)

OTHER PUBLICATIONS

Freeman (Silicones, Published for the Plastics Institute, ILIFFE Books Ltd., 1962, p. 27).
JP201184600 machine translation.

*Primary Examiner* — Kuo Liang Peng

(57) ABSTRACT

A branched polyorganosiloxane having, on average, at least two radical-curable groups per molecule and a curable silicone composition that comprises (I) the branched polyorganosiloxane and (II) a radical initiator. Cured products prepared therefrom. Devices containing the branched polyorganosiloxane, composition, or cured product. Methods of making the branched polyorganosiloxane and composition and methods of using and uses of the materials and devices.

18 Claims, No Drawings

(56) References Cited

U.S. PATENT DOCUMENTS

| | | |
|---|---|---|
| 6,349,312 B1 | 2/2002 | Fresko et al. |
| 6,420,504 B1 | 7/2002 | Yoshitake et al. |
| 6,777,512 B1 | 8/2004 | Sonnenschein et al. |
| 6,806,330 B1 | 10/2004 | Sonnenschein et al. |
| 7,026,399 B2 | 4/2006 | Kim et al. |
| 7,253,307 B1 | 8/2007 | Carlson, Jr. et al. |
| 7,378,482 B2 | 5/2008 | Asch et al. |
| 7,429,636 B2 | 9/2008 | Asch et al. |
| 7,432,338 B2 | 10/2008 | Chapman et al. |
| 7,440,536 B2 | 10/2008 | Bruder et al. |
| 7,449,536 B2 | 11/2008 | Chapman et al. |
| 7,687,585 B2 | 3/2010 | Karthauser |
| 7,700,712 B2 | 4/2010 | Zech et al. |
| 7,850,870 B2 | 12/2010 | Ahn et al. |
| 7,906,605 B2 | 3/2011 | Cray et al. |
| 7,932,319 B2 | 4/2011 | Yamamoto et al. |
| 8,110,630 B2 | 2/2012 | Lin et al. |
| 8,168,737 B2 | 5/2012 | Alvarez et al. |
| 8,580,073 B2 | 11/2013 | Behl et al. |
| 8,618,211 B2 | 12/2013 | Bhagwagar et al. |
| 8,889,261 B2 | 11/2014 | Carbary et al. |
| 9,045,647 B2 | 6/2015 | Kleyer et al. |
| 2002/0061998 A1 | 5/2002 | Cray et al. |
| 2003/0171487 A1 | 9/2003 | Ellsworth et al. |
| 2007/0289495 A1 | 12/2007 | Cray et al. |
| 2010/0092690 A1 | 4/2010 | Alvarez et al. |
| 2010/0183525 A1 | 7/2010 | Lin |
| 2012/0245272 A1* | 9/2012 | Dent .............. C08G 77/50 524/502 |
| 2015/0361320 A1 | 12/2015 | Tang et al. |

FOREIGN PATENT DOCUMENTS

| | | |
|---|---|---|
| WO | 1998040425 | 9/1998 |
| WO | 2000005652 | 2/2000 |
| WO | 2004037941 | 5/2004 |
| WO | 2008133228 | 11/2008 |
| WO | 2010008749 | 1/2010 |
| WO | 2010141852 | 12/2010 |
| WO | 2011056832 | 5/2011 |
| WO | 2012064989 | 5/2012 |
| WO | 2014124362 | 8/2014 |
| WO | 2014124364 | 8/2014 |
| WO | 2014124367 | 8/2014 |
| WO | 2014124378 | 8/2014 |
| WO | 2014124382 | 8/2014 |
| WO | 2014124388 | 8/2014 |
| WO | 2014124389 | 8/2014 |

* cited by examiner

BRANCHED POLYORGANOSILOXANES AND RELATED CURABLE COMPOSITIONS, METHODS, USES, AND DEVICES

The present invention generally relates to branched polyorganosiloxanes, radical-curable silicone compositions comprising the branched polyorganosiloxanes, cured products prepared therefrom, methods for making and using same, devices containing same, and uses thereof.

CROSS-REFERENCE TO RELATED APPLICATIONS

This application is a U.S. nonprovisional filing under 35 U.S.C. § 111(a) which claims the benefit under 35 U.S.C. § 119 (e) of U.S. Provisional Patent Application No. 62/251,173 filed under 35 U.S.C. § 111(b) on Nov. 5, 2015. U.S. Provisional Patent Application No. 62/251,173 is hereby incorporated by reference.

BACKGROUND OF THE RELATED ART

Polyorganosiloxane compositions may be prepared by mixing constituents comprising polydiorganosiloxanes having curable or reactive groups with crosslinking agents and/or catalysts, as needed. Different types of curable groups may be used such as hydrolyzable groups, radical-curable groups, and/or heat curable groups. Generally, the polydiorganosiloxanes have greater than 2 reactive groups per chain. Compositions including these constituents can then be cured to make elastomeric materials by, for example, exposing the compositions to atmospheric moisture, radiation, or heat, depending on the curable groups present. Generally, the greater the number of curable groups on the polydiorganosiloxanes and/or the crosslinking agents, the greater the crosslink density of the resulting elastomeric material.

The cure rate of a particular composition depends on various factors including the type, specific structure, and number of reactive group(s) present. Within the same group type (e.g., an alkoxy or a carboxy group), different structures within a group have different reactivities (e.g., methoxy versus ethoxy within alkoxy group). For example, for hydrolyzable groups in the presence of moisture, a silicon-bonded acetoxy group will usually hydrolyze more rapidly than a silicon-bonded alkoxy group when all other conditions are the same. Furthermore, even groups of the same structure (e.g., two methoxy groups) can have different reactivities depending on the number of those curable groups bonded to a particular silicon atom. For example, if a polydiorganosiloxane has three silicon-bonded alkoxy groups bonded to one silicon atom on a chain end, then the first alkoxy group is generally most reactive (reacts most quickly). The structure of a polymer can also impact cure rate. For example, for a given number of reactive groups a higher concentration of reactive groups near the terminal of a polymer can lead to increased cure speeds as described in WO2014124364, and the accessibility of reactive groups can also impact cure speed. There is a continuing need to prepare polyorganosiloxanes with more efficient cure and faster cure rate by having more easily accessible reactive groups per molecule.

Polymer structure, chain length, and crosslink density all have an impact on physical properties of the final cured product. Furthermore, to show utility of the resulting cured product for specific applications such as certain silicone adhesive applications, reinforcing filler may be added to the composition to improve the physical property profile (e.g., increase tensile strength and increase % elongation to break). As an alternative example, for applications where heat management is required, thermally conductive filler may be added to the composition to provide thermal conductivity to the composition and so forth.

BRIEF SUMMARY OF THE INVENTION

The present invention provides branched polyorganosiloxanes and curable silicone compositions containing same that provide advantages in curing properties in combination with the desired physical and mechanical properties desired for a wide variety of applications.

The present invention discloses a branched polyorganosiloxane; a curable silicone composition comprising (I) a branched polyorganosiloxane having, on average, greater than two radical-curable groups per molecule and (II) a radical initiator; a cured product prepared by curing the curable silicone composition; methods of making the branched polyorganosiloxane, curable silicone composition and cured product; methods of using these materials; devices comprising the branched polyorganosiloxane, curable silicone composition, and/or cured product; and methods of using and uses thereof.

The radical-curable branched polyorganosiloxane (I) is of formula:

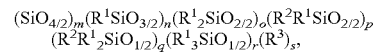

$(SiO_{4/2})_m(R^1SiO_{3/2})_n(R^1{}_2SiO_{2/2})_o(R^2R^1SiO_{2/2})_p$
$(R^2R^1{}_2SiO_{1/2})_q(R^1{}_3SiO_{1/2})_r(R^3)_s,$ wherein each $R^1$ is independently a monovalent organic group free of aliphatic unsaturation; each $R^2$ is independently a radical-curable group; each $R^3$ is independently an alkylene having 2 to 12 carbon atoms; subscript m is from 0 to 20; subscript n is from 0 to 20; with the proviso that the sum of subscripts m+n is from 1 to 20; subscript o is from 50 to 1000; subscript p is from 0 to 100; subscript q is from 0 to 42; with the proviso that the sum of subscripts p+q is greater than 2; subscript r is from 0 to 42; with the proviso that the sum of subscripts q+r=n+2m+2; and subscript s is from greater than 2 to less than 100. The branched polyorganosiloxane has, on average, at least 2 radical-curable groups (e.g., $R^2$) per molecule.

The (radical-)curable silicone composition may be used with or over a wide variety of substrate materials and in a wide variety of applications.

DETAILED DESCRIPTION OF THE INVENTION

The Brief Summary and the Abstract are hereby incorporated by reference. All U.S. patent application publications and patents referenced below, or a portion thereof if only the portion is referenced, are hereby incorporated herein by reference to the extent that the incorporated subject matter does not conflict with the present description, which would control in any such conflict.

The description of this invention uses certain terms and expressions. As used herein, "alternatively" refers to a separate and distinct embodiment. As used herein, "contacting" means bringing into physical contact. "Include" is non-limiting; it is open-ended like comprising or having. "Operative" means functionally effective, wherein the effect may be a direct effect, alternatively an indirect affect. For example, reactants may be brought into direct physical contact in a reaction thereof, with or without a catalyst; and components of an article or device may be brought into "operative contact," which includes direct physical touching, alternatively indirect touching via one or more intermediary components. "Optionally" means is absent, alternatively is present. Any Markush group comprising a genus and subgenus therein includes the subgenus in the genus, e.g., in "R is hydrocarbyl or alkenyl," R may be alkenyl, alternatively R may be hydrocarbyl, which includes, among other subgenuses, alkenyl. As used herein, "may" confers a choice, not an imperative. All "molecular weight" of a macromolecular material, such as a number average molecular weight ($M_n$) or weight average molecular weight ($M_w$) of a polymer, is determined using gel permeation chromatography and polystyrene standards unless noted herein otherwise. The term "silicone" includes linear, branched, or a mixture of linear and branched polyorganosiloxane macromolecules. All "wt %" (weight percent) are, unless otherwise noted, based on total weight of all ingredients or constituents used to make the composition or formulation, which adds up to 100 wt %. The articles a, an, and the each refer to one or more, unless otherwise indicated. All amounts, ratios, and percentages in this application are by weight, unless otherwise indicated. As used herein, the term "radical-curable" means polymerizable by a free radical curing mechanism. The curing mechanism may be a heat curing or a radiation curing mechanism. A heat curing mechanism may involve applying heat to a thermal radical-curable material and may be initiated by thermal radical initiation or by an organoborane initiation. The organoborane initiation is when an amine reactive compound is added to a thermal radical-curable material to initiate curing thereof instead of applying heat thereto. The radiation curing mechanism may involve applying radiation to a radiation radical-curable material and may be initiated by radiation radical initiation or redox reaction. Thus, the radical-curable material may further comprise a free radical initiator such as a peroxide (e.g., an organic peroxide), which may be activated by said heat or radiation. The radical-curable material is composed of a molecule that has, or a collection of molecules that independently have, at least one type of radical-curable group.

As used herein, a "radical-curable group" (e.g., $R^2$) is a monovalent organic functional group that contains at least two carbon atoms and has at least one carbon-carbon double bond, at least one carbon-carbon triple bond, or at least one oxiranyl. Typically, each radical-curable group independently has from 2 to 12 carbon atoms, alternatively from 2 to 10 carbon atoms, alternatively from 2 to 8 carbon atoms, alternatively from 2 to 6 carbon atoms, alternatively from 2 to 4 carbon atoms, alternatively 2 or 3 carbon atoms, alternatively 2 or 4 carbon atoms, alternatively 3 or 4 carbon atoms. Typically, each radical-curable group (e.g., each $R^2$) independently contains from one to three, alternatively one or two, alternatively one, alternatively two groups independently selected from the carbon-carbon double bond, carbon-carbon triple bond, and oxiranyl. Examples of different types of radical-curable groups are aliphatically unsaturated hydrocarbyl groups, monovalent aliphatically unsaturated ester groups, and epoxy-functional monovalent organic groups. Examples of aliphatically unsaturated hydrocarbyl groups that are radical-curable groups are unsubstituted aliphatically unsaturated hydrocarbyl groups such as vinyl, allyl, a propenyl, a butenyl, a hexenyl, an ethynyl, and a propynyl. The aliphatically unsaturated hydrocarbyl groups are also hydrosilylation curable by a hydrosilylation reaction with SiH groups. Examples of aliphatically unsaturated ester groups that are radical-curable groups are acrylate and methacrylate groups. Examples of epoxy-functional monovalent organic groups that are radical-curable groups are oxiranyl and glycidyloxypropyl groups, When the radical-curable groups of the radical-curable branched polyorganosiloxane (I) are the aliphatically unsaturated hydrocarbyl groups, the radical-curable branched polyorganosiloxane (I) may have been made by hydrosilylation curing a first reactant containing aliphatically unsaturated hydrocarbyl groups and a second reactant containing SiH groups, wherein the molar amount of the aliphatically unsaturated hydrocarbyl groups of the first reactant is greater than the molar amount of the SiH groups of the second reactant. As a result, some of the aliphatically unsaturated hydrocarbyl groups of the first reactant participate in the hydrosilylation reaction and the remainder of the aliphatically unsaturated hydrocarbyl groups of the first reactant are carried through to and become radical-curable groups in the radical-curable branched polyorganosiloxane (I). When the radical-curable groups of the radical-curable branched polyorganosiloxane (I) are aliphatically unsaturated ester groups and/or epoxy-functional monovalent organic groups, the radical-curable branched polyorganosiloxane (I) may have been made by hydrosilylation curing a third reactant containing aliphatically unsaturated hydrocarbyl groups and a fourth reactant containing SiH groups, wherein at least one of the third and fourth reactants further contain the aliphatically unsaturated ester groups and/or epoxy-functional monovalent organic groups. The molar amount of the aliphatically unsaturated hydrocarbyl groups of the third reactant may be equal to or greater than the molar amount of the SiH groups of the fourth reactant. As a result, some or all of the aliphatically unsaturated hydrocarbyl groups of the third reactant participate in the hydrosilylation reaction and the aliphatically unsaturated ester groups and/or epoxy-functional monovalent organic groups of the third and/or fourth reactants are carried through to and become radical-curable groups in the radical-curable branched polyorganosiloxane (I).

The curable silicone composition may be curable by various mechanisms. Typically, the curable silicone composition is a radical-curable silicone composition that comprises (I) a branched polyorganosiloxane having, on average, greater than two radical-curable groups per molecule (e.g., >two $R^2$ per molecule); and (II) a radical initiator package. The branched polyorganosiloxane (I) is radical-curable. Optionally, the radical-curable silicone composition may further comprise (III) a silicone reactive diluent, and/or one or more other optional constituents. Other optional constituents may include (IV) and (V) fillers and filler treating agents, and (VI) (VII) and (VIII) secondary condensation cure constituents. Further optional constituents may include (IX) adhesion promoters, (X) reactive organic monomers (or oligomers), (XI) polymerization inhibitors, (XII) colorants, (XIII) solvents, and (XIV) corrosion inhibitors. The optional constituents may provide features desired for various applications, for example sealant applications such as sealing an assembly, forming a lid seal (e.g. automotive lid seal or microelectronics lid seal), or forming a terminal sealant; or adhesive applications such as a low-temperature-cure adhesive, a die attach adhesive, or a thermally conductive adhesives. In some embodiments the curable silicone composition and cured product prepared therefrom are free of solid particulate filler, alternatively are free of silica, alternatively are free of any fumed silica, alternatively are free of an untreated fumed silica, alternatively are free of a treated fumed silica.

Constituent (I) is a radical-curable branched polyorganosiloxane of formula:

$$(SiO_{4/2})_m(R^1SiO_{3/2})_n(R^1{}_2SiO_{2/2})_o(R^2R^1SiO_{2/2})_p(R^2R^1{}_2SiO_{1/2})_q(R^1{}_3SiO_{1/2})_r(R^3)_s,$$

wherein each $R^1$ is independently a monovalent organic group free of aliphatic unsaturation; each $R^2$ is independently a radical-curable group; each $R^3$ is independently a divalent hydrocarbon having 2 to 12 carbon atoms; subscript m is from 0 to 20; subscript n is from 0 to 20; with the proviso that the sum of subscripts m+n is from 1 to 20; subscript o is from 50 to 1000; subscript p is from 0 to 100; subscript q is from 0 to 42; with the proviso that the sum of subscripts p+q is greater than 2; subscript r is from 0 to 42; with the proviso that the sum of subscripts q+r=n+2m+2; and subscript s is from greater than 2 to less than 100. The radical-curable branched polyorganosiloxane (I) has, on average, at least two radical-curable groups (e.g., $R^2$) per molecule. The repeat units in formula (I) are conventional Q, T, D and M units of polyorganosiloxanes and an internal linker ($R^3$) that had been formed by a hydrosilylation reaction used to make said radical-curable branched polyorganosiloxane (I). Subscripts m, n, o, p, q, r, and s independently are rational or irrational numbers as defined herein and represent an average mole fraction of their respective repeat units in the radical-curable branched polyorganosiloxane (I). The subscript m is an average mole fraction of a Q unit independently of formula $SiO_{4/2}$. The subscript n is an average mole fraction of T-type unit independently of formula $R^1SiO_{3/2}$. The subscript o is an average mole fraction of a first D-type unit independently of formula $R^1{}_2SiO_{2/2}$. The subscript p is an average mole fraction of a second D-type unit independently of formula $R^2R^1SiO_{2/2}$. The subscript q is an average mole fraction of a first M-type repeat unit of independently formula $R^2R^1{}_2SiO_{1/2}$. The subscript r is an average mole fraction of a second M-type repeat unit independently of formula $R^1{}_3SiO_{1/2}$. The subscripts is an average mole fraction of an alkylene linker independently of formula $R^3$, which is covalently bonded to two of the foregoing T-type, D-type, or M-type repeat units. The order of the repeat units (the units modified by subscripts m, n, o, p, q, and r) and the linker ($R^3$) in the above formula (I) is shown for convenience and the formula does not require or indicate a given macromolecule encompassed by the formula (I) to have any particular sequence of repeat units therein.

In some aspects subscript m is >0. In some aspects subscript n is 0. In some aspects subscript p is 0. In some aspects m is >0 and n is 0. In some aspects m is >0, n is 0, and p is 0, and the radical-curable branched polyorganosiloxane (I) is of formula $(SiO_{4/2})_m(R^1{}_2SiO_{2/2})_o(R^2R^1{}_2SiO_{1/2})_q(R^1{}_3SiO_{1/2})_r(R^3)_s$ wherein subscript m is from 1 to 20; and $R^1$, $R^2$, $R^3$, and subscripts o, q, r, and s are as defined above. In some such aspects, m is 1; o is from 100 to 1,100, alternatively from 145 to 1049; q is from 2 to 4, alternatively from 2.5 to 3.6, alternatively from 3 to 3.5; r is from 0.4 to 1.1, alternatively from 0.5 to 1; and s is from 2 to 6, alternatively from 2.5 to 6, alternatively from 3 to 3.6. In some aspects the radical-curable branched polyorganosiloxane (I) is any one of Pol1, Pol2, Pol3, Pol4, Pol6, and Pol7 described later in the Examples.

In some aspects subscript m is 0. In some aspects subscript n is >0. In some aspects subscript p is 0. In some aspects subscript r is 0. In some aspects m is 0, p is 0, r is 0, and n is >0, and the radical-curable branched polyorganosiloxane (I) is of formula $(R^1SiO_{3/2})_n(R^1{}_2SiO_{2/2})_o(R^2R^1{}_2SiO_{1/2})_q(R^3)_s$ wherein subscript n is from 1 to 20; and $R^1$, $R^2$, $R^3$, and subscripts o, q, and s are as defined above. In some such aspects, n is from 0.7 to 1.1, alternatively from 0.75 to 0.9, alternatively 0.8; o is from 450 to 549, alternatively from 475 to 525, alternatively from 490 to 510; q is from 2.0 to 2.9, alternatively from 2.1 to 2.8, alternatively from 2.3 to 2.5; and s is from 2.0 to 2.9, alternatively 2.1 to 2.8, alternatively from 2.3 to 2.5. In some aspects the radical-curable branched polyorganosiloxane (I) is Pol5 described later in the Examples.

In some aspects subscript m is >0 and subscript n is >0 and the radical-curable branched polyorganosiloxane (I) is of formula $$(SiO_{4/2})_m(R^1SiO_{3/2})_n(R^1{}_2SiO_{2/2})_o(R^2R^1SiO_{2/2})_p(R^2R^1{}_2SiO_{1/2})_q(R^1{}_3SiO_{1/2})_r(R^3)_s$$

wherein subscript m is from >0 to <20, subscript n is from >0 to <20 with the proviso that the sum of subscripts m+n is from 1 to 20; and $R^1$, $R^2$, $R^3$, and subscripts o, p, q, r, and s are as defined above. In some such aspects subscript p is 0, alternatively subscript r is 0, alternatively p is 0 and r is 0.

Suitable monovalent organic groups for $R^1$, and independently for that matter any other "R" group that is a monovalent organic group, include a hydrocarbyl group exemplified by alkyl, cycloalkyl, and aryl. Examples are ($C_1$-$C_{20}$) alkyl such as methyl, ethyl, propyl, butyl, pentyl, octyl, undecyl, and octadecyl; ($C_3$-$C_{10}$)cycloalkyl such as cyclohexyl; and ($C_6$-$C_{12}$)aryl such as phenyl, tolyl, xylyl, benzyl, and 2-phenylethyl. A group having aliphatic unsaturation means an organic group containing at least one carbon-carbon double bond (C=C) or at least one carbon-carbon triple bond (C≡C). Suitable radical-curable groups for $R^2$ include an aliphatically unsaturated monovalent hydrocarbyl group exemplified by alkenyl groups and alkynyl groups. Examples of alkenyl groups are such as vinyl, allyl, propenyl, and butenyl; and alkynyl groups such as ethynyl and propynyl. Alternatively, $R^2$ is a monovalent organic group containing an acrylate group or a methacrylate group. An acrylate group is of formula $H_2C=CHCO_2-$. A methacrylate group is of any one of the following formulas: $H_2C=CCH_3CO_2-$, cis $CH_3HC=CHCO_2-$, and trans $CH_3HC=CHCO_2-$. Suitable divalent organic groups for $R^3$, and independently for that matter any other "R" group that is an acyclic divalent organic group from 2 to 12 carbon atoms, and be straight chain or branched chain. Examples of such acyclic divalent organic groups for $R^3$ are ($C_2$-$C_{12}$) alkylene, alternatively ($C_7$-$C_{12}$)alkylene, alternatively ($C_2$-$C_6$)alkylene, alternatively ($C_2$-$C_4$)alkylene, alternatively ethylene (i.e., $CH_2CH_2$), alternatively propylene (i.e., $CH_2CH_2CH_2$), alternatively propenylene (i.e., CH=CHCH_2$), alternatively methylethylene (i.e., $CH_2CH(CH_3)$), alternatively butylene (i.e., $CH_2CH_2CH_2CH_2$), alternatively hexylene (i.e., $CH_2CH_2CH_2CH_2CH_2CH_2$).

The method or process for making the radical-curable branched polyorganosiloxane (I) may yield a product of a reaction of constituents comprising: (a) a branched polyorganosiloxane having, on average, two or greater than two silicon bonded hydrogen atoms per molecule; and (b) a reactive species having, per molecule, at least one aliphatically unsaturated organic group and one or more radical-curable groups selected from acrylate groups and methacrylate groups. The reaction may be run in the presence of (c) a hydrosilylation catalyst. Optionally, the reaction may also be run in the presence of (d) an isomer concentration reducing agent and/or (e) a polymerization inhibitor, optionally after reaction followed by the addition of (f) a catalyst inhibitor. Constituent (a) is hydrosilylation curable. Constituent (b) is separately hydrosilylation curable and radical curable. The reaction makes the radical-curable branched polyorganosiloxane (I), which is a radical-curable material.

Constituents (a), (b), and (c), and optionally optional constituents (d) and (e) are blended together. The reaction may then be initiated by raising the temperature to from 35° C. to 100° C., alternatively from 50° C. to 85° C., and maintaining the temperature until all of the (FT-IR detectable) Si—H has reacted, as measured by the Si—H peak as observed by Fourier-Transform Infrared spectroscopy (FT-IR) at about 2170 $cm^{-1}$ being reduced into the background noise of the FT-IR spectra, which may be acquired using 32 scans each. Alternatively or additionally, the amount of Si—H may be quantitatively determined using GC Test Method 1 described later. Next, if desired the optional catalyst inhibitor (f) is added to the resulting mixture to deactivate the hydrosilylation catalyst (c). In certain embodiments, the introduction of the catalyst inhibitor (f) is done after reducing the temperature of the reaction mixture of constituents (a), (b), and (c), and, if present, optional constituents (d) and (e) below the minimum reaction temperature of 50° C., such as at room temperature (23° C.). In certain embodiments, unreacted constituents, and any volatile by-products, may be separated from the reaction product by vacuum stripping the same at temperatures from 23° C. to less than 100° C., alternatively from 23° C. to less than 85° C. The synthesized radical-curable branched polyorganosiloxane (I) may be stored for subsequent use. The subsequent use of the radical-curable branched polyorganosiloxane (I) may be as a reactant in a radical curing reaction as described later.

Constituent (a) is a branched polyorganosiloxane having on average, per molecule, greater than two silicon-bonded hydrogen groups (SiH groups), which are capable of undergoing a hydrosilylation reaction with an aliphatically unsaturated group of constituent (b). Constituent (a) is hydrosilylation curable. Constituent (a) may be composed of collection of the same branched polyorganosiloxane molecules. Alternatively, constituent (a) may be composed of a combination comprising two or more branched polyorganosiloxanes that differ in at least one of the following properties: structure, viscosity, degree of polymerization, and sequence.

The structure of constituent (a) as described herein is such that upon reaction with constituent (b), the structure described above for the radical-curable branched polyorganosiloxane (I) is synthesized. If desired, the reaction product containing the radical-curable branched polyorganosiloxane (I) may be stored for future use or the radical-curable branched polyorganosiloxane (I) may be isolated and stored. The structure of constituent (a) differs from the structure of the radical-curable branched polyorganosiloxane (I) in a number of ways such that the structure of constituent (a) contains >2 SiH groups per molecule on average, whereas the structure of the radical-curable branched polyorganosiloxane (I) lacks or is free of SiH groups detectable by FT-IR, which spectra may be acquired using 32 scans each; and the structure of constituent (a) does not have a portion that has been derived from constituent (b), whereas the structure of the radical-curable branched polyorganosiloxane (I) does have a portion that has been derived from constituent (b) by a hydrosilylation reaction between constituents (a) and (b). Suitable polyorganosiloxanes for constituent (a) may be commercially available or may be manufactured by any means that would yield the desired structure.

Constituent (a) may be manufactured in a separate process by reacting (a1) a branched polyorganosiloxane having on average, per molecule, greater than two aliphatically unsaturated groups; with (a2) a organohydrogensiloxane having two silicon bonded hydrogen atoms; in the presence of (c) a hydrosilation catalyst. The (a2) organohydrogensiloxane has an excess of SiH groups relative to the aliphatically unsaturated groups of (a1) such that some of the SiH groups of (a2) organohydrogensiloxane remain intact during reaction of (a2) organohydrogensiloxane with (a1) a branched polyorganosiloxane so that the resulting manufactured constituent (a) has on average per molecule at least two SiH groups.

Constituents (a1), (a2), and (c) are blended together, such as by mixing. The reaction may then be initiated by raising the temperature to from 30° C. to 150° C., alternatively from 50° C. to 100° C., while mixing. The time and temperature useful for reaction will depend on actual structure of constituents and level of component (c) used. In certain embodiments, remaining amounts of unreacted constituent (a2) may be removed from mixture by vacuum stripping. Conditions for effective stripping will depend upon the exact composition of constituent (a2). The made branched polyorganohydrogensiloxane (a) may be stored for subsequent use or immediately processed further to make radical-curable branched polyorganosiloxane (I).

The structure of constituent (a1) as described herein is such that upon completion of reaction, the desired structure for constituent (a) is synthesized. Constituent (a1) may be composed of collection of the same branched polyorganosiloxane molecules. Alternatively, constituent (a1) may be composed of a combination comprising two or more branched polyorganosiloxanes that differ in at least one of the following properties: structure, viscosity, degree of polymerization, and sequence. The location of the silicon-bonded hydrogen on constituent (a2) is not limited, and may be pendant and/or terminal, but is preferably terminal. Constituent (a2) may be cyclic, branched, or linear. Constituent (a2) may be composed of collection of the same organohydrogensiloxane molecules. Alternatively, constituent (a) may be composed of a combination comprising two or more polyorganohydrogensiloxanes that differ in at least one of the following properties: structure, viscosity, degree of polymerization, and sequence. Constituent (a2) can have a degree of polymerization (dP) from 2 to 150. The molar ratio of silicon-bonded hydrogen atoms in constituent (a2) to aliphatically unsaturated groups in constituent (a1) may be from 5:1 to 1.5:1, alternatively from 3:1 to 2:1. Excess amounts of constituent (a2), relative to amounts of constituent (a1), optionally may or may not be separated from product constituent (a), but in some aspects are separated therefrom. Such separation may be, for example, by means of stripping under vacuum. The manufactured constituent (a) can then be used to make the radical-curable branched polyorganosiloxane (I) as described above.

Alternatively, constituent (a) may be manufactured in situ via reaction of constituents (a1) and (a2) described above, in the presence of constituent (b) and constituent (c) and optionally constituents (d) and (e) described above to directly manufacture the radical-curable branched polyorganosiloxane (I). In this aspect, constituents (a1), (a2), (b), (c) and optionally (d) and (e) are blended together. The reaction may then be initiated by raising the temperature to from 35° C. to 100° C., alternatively 50° C. to 85° C. while mixing, and maintaining the temperature until all of the Si—H has reacted, as measured by the Si—H peak as observed by FT-IR at about 2170 $cm^{-1}$ being reduced into the background noise of the FT-IR spectra, which may be acquired using 32 scans each. Next, the optional catalyst inhibitor (f) is added to the resulting mixture to deactivate the hydrosilylation catalyst (c). In certain embodiments, the introduction of the catalyst inhibitor (f) is done after reducing the temperature of the reaction mixture of (a1), (a2), (b), (c), and optionally (d) and (e) below the minimum reaction temperature of 50° C., such as at room temperature. In certain embodiments, unreacted constituents may be separated from the product by vacuum stripping at temperatures less than 100 C, alternatively less than 85 C. The made radical-curable branched polyorganosiloxane (I) may be stored for subsequent use.

Constituent (b) is a reactive species. This reactive species may be any species that can react with SiH groups of constituent (a) and provide the radical-curable groups in the radical-curable branched polyorganosiloxane (I). Constituent (b) is separately hydrosilylation curable and radical curable. The reactive species has an average, per molecule, of at least one aliphatically unsaturated organic group that is capable of undergoing an addition reaction (e.g., a hydrosilylation reaction) with a silicon-bonded hydrogen atom of constituent (a). Constituent (b) further comprises one or more radical-curable groups per molecule. The radical-curable groups are functional (reactive) groups (e.g., $R^2$) that are carried through the reaction of constituent (b) with constituent (a) so as to appear in the radical-curable branched polyorganosiloxane (I), thereby rendering the branched polyorganosiloxane (prepared by the process described above) radical-curable. The radical-curable groups on constituent (b) may be any radical polymerizable group. In some aspects the radical-curable groups on constituent (b) may be selected from acrylate groups and methacrylate groups and combinations thereof. Alternatively, the radical-curable groups on constituent (b) may be selected from acrylate, epoxy, methacrylate, and combinations of any two or more thereof. Alternatively, the radical-curable groups on constituent (b) may be selected from epoxy, and combinations of any two or more thereof. In some aspects the radical-curable groups are all acrylate, alternatively methacrylate, alternatively epoxy, alternatively at least two different ones of the foregoing radical-curable groups. Suitable aliphatically unsaturated organic groups in (b) include vinyl, allyl, propynyl, butenyl, and hexenyl.

For example, constituent (b) may comprise a silane according to the formula: $R^4_j SiR^2 R^1_{(4-j-k)}$, in which each of subscripts j and k independently is from 1 to 3 with the proviso that the sum of subscripts (j+k) is less than or equal to 4. Each $R^4$ is independently an aliphatically unsaturated organic group, each $R^2$ is independently a radical-curable group (such as a monovalent organic group containing an acrylate group or a methacrylate group), and each $R^1$ is independently a monovalent organic group free of aliphatic unsaturation. Suitable aliphatically unsaturated organic groups for $R^4$ include vinyl, allyl, propynyl, butenyl, and hexenyl. Each of $R^1$ and $R^2$ independently may be as defined above.

Alternatively, constituent (b) may comprise an organic compound (which does not contain a silicon atom). The organic compound for constituent (b) may have an average per molecule of 1 to 2 aliphatically unsaturated organic groups, such as alkenyl or alkynyl groups, and one or more radical-curable groups selected from an acrylate group and a methacrylate group. Alternatively, the radical-curable groups may be selected from epoxy, and combinations of any two or more thereof. In some aspects the radical-curable groups are all acrylate, alternatively methacrylate, alternatively epoxy, alternatively at least two different ones of the foregoing radical-curable groups. Examples of suitable organic compounds for constituent (b) include an allyl acrylate and allyl methacrylate (AMA); and combinations thereof.

The amount of constituent (b) used in the reaction mixture in the process or method of synthesizing the radical-curable branched polyorganosiloxane (I) depends on various factors including the type, amount, and Si—H content of constituent (a) and the type of constituent (b) selected. The amount of constituent (b) is sufficient to make the ratio of the total moles of silicon-bonded hydrogen to total moles of aliphatically unsaturated groups on constituent (a) is from 0.7/1 to 1.2/1, alternatively from 0.8/1 to 1.1/1, with the proviso that the mole ratio is as defined above. On a wt % basis there is more of constituent (a) than constituent (b) in the reaction mixture used to make the radical-curable branched polyorganosiloxane (I). Constituent (a) may be from >50 wt % to 99 wt % and constituent (b) may be from <50 wt % to 1 wt %, respectively, based on total weight of constituents (a) plus (b).

Constituent (c) is a hydrosilylation catalyst, which accelerates the hydrosilylation reaction of constituents (a) and (b), or in other embodiments the hydrosilylation reaction of constituents (a1), (a2), and (b). Constituent (c) may be added in an amount sufficient to promote the reaction of constituents (a) and (b), and this amount may be, for example, sufficient to provide 0.1 part per million (ppm) to 1000 ppm of platinum group metal, alternatively from 1 ppm to 500 ppm, alternatively from 2 ppm to 200, alternatively from 5 ppm to 150 ppm, of platinum group metal, all based on the combined weight of all constituents used in the reaction mixture in the process or method of synthesizing the radical-curable branched polyorganosiloxane (I).

Suitable hydrosilylation catalysts for constituent (c) are generally known in the art and commercially available. Constituent (c) may comprise a platinum group metal selected from platinum (Pt), rhodium, ruthenium, palladium, osmium or iridium metal or organometallic compound thereof, or a combination thereof. Constituent (c) is exemplified by compounds such as chloroplatinic acid, chloroplatinic acid hexahydrate, platinum dichloride, and complexes of said compounds with low molecular weight organopolysiloxanes or platinum compounds microencapsulated in a matrix or core-shell type structure. Complexes of platinum with low molecular weight organopolysiloxanes include 1,3-diethenyl-1,1,3,3-tetramethyldisiloxane complexes with platinum. These complexes may be microencapsulated in a resin matrix. Alternatively, the catalyst may comprise 1,3-diethenyl-1,1,3,3-tetramethyldisiloxane complex with platinum. When the catalyst is a platinum complex with a low molecular weight organopolysiloxane, the amount of catalyst may be from 0.04 wt % to 0.4 wt % based on the combined weight of the constituents used in the reaction mixture in the process or method of synthesizing the radical-curable branched polyorganosiloxane (I).

Suitable hydrosilylation catalysts for constituent (c) are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are generally known in the art, as exemplified in U.S. Pat. Nos. 4,766,176; and 5,017,654.

Optional constituent (d) is an isomer concentration reducing agent. In certain embodiments, the isomer concentration reducing agent comprises a carboxylic acid compound. The carboxylic acid compound may comprise (1) carboxylic acid, (2) an anhydride of a carboxylic acid, (3) a carboxylic silyl ester, and/or (4) a substance that will produce the above-mentioned carboxylic acid compounds (i.e., (1), (2), and/or (3)) through a reaction or decomposition in the reaction of the method. A mixture of one or more of these carboxylic acid compounds may be utilized as the isomer concentration reducing agent. For example, a carboxylic silyl ester may be utilized in combination with an anhydride of a carboxylic acid as the isomer concentration reducing agent. In addition, a mixture within one or more types of carboxylic acid compounds may be utilized as the isomer concentration reducing agent. For example, two different carboxylic silyl esters may be utilized in concert, or two carboxylic silyl esters may be utilized in concert with an anhydride of a carboxylic acid.

When the isomer concentration reducing agent (d) comprises (1) carboxylic acid, any carboxylic acid having carboxyl groups may be utilized. Suitable examples of carboxylic acids include saturated carboxylic acids, unsaturated carboxylic acids, monocarboxylic acids, and dicarboxylic acids. A saturated or unsaturated aliphatic hydrocarbyl group, aromatic hydrocarbyl group, halogenated hydrocarbyl group, hydrogen atom, or the like is usually selected as the portion other than the carboxyl groups in these carboxylic acids. Specific examples of suitable carboxylic acids include saturated monocarboxylic acids such as formic acid, acetic acid, propionic acid, n-butyric acid, isobutyric acid, hexanoic acid, cyclohexanoic acid, lauric acid, and stearic acid; saturated dicarboxylic acids such as oxalic acid and adipic acid; aromatic carboxylic acids such as benzoic acid and para-phthalic acid; carboxylic acids in which the hydrogen atoms of the hydrocarbyl groups of these carboxylic acids have been substituted with a halogen atom or an organosilyl group, such as chloroacetic acid, dichloroacetic acid, trifluoroacetic acid, para-chlorobenzoic acid, and trimethylsilylacetic acid; unsaturated fatty acids such as acrylic acid, methacrylic acid, and oleic acid; and compounds having hydroxy groups, carbonyl groups, or amino groups in addition to carboxyl groups, namely, hydroxy acids such as lactic acid, keto acids (oxo acids) such as acetoacetic acid, aldehyde acids such as glyoxylic acid, and amino acids such as glutamic acid.

When the isomer concentration reducing agent (d) comprises (2) an anhydride of carboxylic acid, suitable examples of anhydrides of carboxylic acids include acetic anhydride, propionic anhydride, and benzoic anhydride. These anhydrides of carboxylic acids may be obtained via a reaction or decomposition in the reaction system include acetyl chloride, butyryl chloride, benzoyl chloride, and other carboxylic acid halides, carboxylic acid metal salts such as zinc acetate and thallium acetate, and carboxylic esters that are decomposed by light or heat, such as (2-nitrobenzyl) propionate.

In aspects where the isomer concentration reducing agent (d) comprises (3) a carboxylic silyl ester, suitable examples of carboxylic silyl esters are trialkylsilylated carboxylic acids, such as trimethylsilyl formate, trimethylsilyl acetate, triethylsilyl propionate, trimethylsilyl benzoate, and trimethylsilyl trifluoroacetate; and di-, tri-, or tetracarboxysilylates, such as dimethyldiacetoxysilane, diphenyldiacetoxysilane, methyltriacetoxysilane, ethyltriacetoxysilane, vinyltriacetoxysilane, d i-t-butoxydiacetoxysilane, and silicon tetrabenzoate.

In aspects where the isomer concentration reducing agent (d) comprises (1) and (2), alternatively (1) and (3), alternatively (2) and (3), the respective (1), (2), and (3) are as described above.

The isomer concentration reducing agent (d), when present, is typically utilized in an amount from 0.001 to 1 weight percent, alternatively from 0.01 to 0.1 weight percent, based on the theoretical total weight of the radical-curable branched polyorganosiloxane (I) to be made in the process or method of synthesizing the radical-curable branched polyorganosiloxane (I). Examples of commercially available carboxylic silyl esters suitable as the isomer concentration reducing agent are DOW CORNING® ETS 900 or XIAMETER® OFS-1579 Silane, both available from Dow Corning Corporation of Midland, Mich., USA and comprising an acetoxysilane mixture of ethyltriacetoxysilane (30% to <50%), methyltriacetoxysilane (30% to <50%), oligomers of methyl-ethyl acetoxysilane (1% to <5%), and acetic anhydride (0.1% to <1%).

The isomer concentration reducing agent (d), added in a sufficient amount such as from 0.001 to 1 weight percent as noted above, beneficially promotes the alpha-addition of the Si—H groups of the polyorganohydrogensiloxane (a) to the aliphatically unsaturated group of the reactive species (b) over the beta-addition of the Si—H groups of the polyorganohydrogensiloxane (a) to the aliphatically unsaturated group of the reactive species (b). Thus, the concentration of the beta-addition isomer reaction product is lower when the reaction is run in the presence of the isomer concentration reducing agent (d) relative to what the concentration of the beta-addition isomer reaction product would have been under the same reaction conditions except in the absence of the isomer concentration reducing agent (d). The beta-position addition may result in the subsequent further reaction of the polyorganohydrogensiloxane (a) to generate Si—OH and associated silicon hydroxide product (sometimes referred to as D(Oz) and/or T(Oz) units). Without being bound by any theory, it is believed that the generation of Si—OH hastens moisture cure of the polyorganohydrogensiloxane (a). The relative amount of D(Oz) units generated, which correlate to the amount of beta-position addition of Si—H groups of the polyorganohydrogensiloxane (a) to the aliphatically unsaturated group of the reactive species (b), may be measured by NMR.

The radical-curable branched polyorganosiloxane (I) produced in accordance with aspects of the process or method of the present invention utilizing a sufficient amount of isomer concentration reducing agent (d) results in a reduction, and in certain embodiments at least a 10% reduction, in the amount of D(Oz) units present in the made radical-curable branched polyorganosiloxane (I), as measured by NMR, which corresponds to a reduction, and in certain embodiments at least a 10% reduction in the beta-addition of Si—H groups of the polyorganohydrogensiloxane to the aliphatically unsaturated group of the reactive species (b).

Optional constituent (e) is a polymerization inhibitor, which may be used for process safety and shelf life. The unsaturated groups (e.g. methacrylate, acrylate, vinyl or allyl) are radical-curable and can prematurely autopolymerize via radical process. Such premature radical polymerization processes may occur in the process of making the radical-curable branched polyorganosiloxane (I) and can be inhibited by the addition of polymerization inhibitor thereto. Examples of suitable polymerization inhibitors for inhibiting radical polymerization of acrylate and methacrylate groups include: 2,6,-Di-tert-butyl-4-(dimethylaminomethyl) phenol (DBAP), hydroquinone (HQ); 4-methoxyphenol (MEHQ); 4-ethoxyphenol; 4-propoxyphenol; 4-butoxyphenol; 4-heptoxyphenol; butylated hydroxytoluene (BHT); hydroquinone monobenzylether; 1,2-dihydroxybenzene; 2-methoxyphenol; 2,5-dichlorohydroquinone; 2,5-di-tertbutylhydroquinone; 2-acetylhydroquinone; hydroquinone monobenzoate; 1,4-dimercaptobenzene; 1,2-dimercaptobenzene; 2,3,5-trimethylhydroquinone; 4-aminophenol; 2-aminophenol; 2-N, N-dimethylaminophenol; 2-mercaptophenol; 4-mercaptophenol; catechol monobutylether; 4-ethylaminophenol; 2,3-dihydroxyacetophenone; pyrogallol-1, 2-dimethylether; 2-methylthiophenol; t-butyl catechol; di-tert-butylnitroxide; di-tert-amylnitroxide; 2,2,6,6-tetramethyl-piperidinyloxy; 4-hydroxy-2,2,6,6-tetramethyl-piperidinyloxy; 4-oxo-2,2,6,6-tetramethyl-piperidinyloxy; 4-dimethylamino-2,2,6,6-tetramethyl-piperidinyloxy; 4-amino-2,2,6,6-tetramethyl-piperidinyloxy; 4-ethanoloxy-2,2,6,6-tetramethyl-piperidinyloxy; 2,2,5,5-tetramethyl-pyrrolidinyloxy; 3-amino-2,2,5,5-tetramethyl-pyrrolidinyloxy; 2,2,5,5-tetramethyl-1-oxa-3-azacyclopentyl-3-oxy; 2,2,5,5-tetramethyl-3-pyrrolinyl-1-oxy-3-carboxylic acid; 2,2,3,3,5,5,6,6-octamethyl-1,4-diazacyclohexyl-1,4-dioxy; salts of 4-nitrosophenolate; 2-nitrosophenol; 4-nitrosophenol; copper dimethyldithiocarbamate; copper diethyldithiocarbamate; copper dibutyldithiocarbamate; copper salicylate; methylene blue; iron; phenothiazine (PTZ); 3-oxophenothiazine; 5-oxophenothiazine; phenothiazine dimer; 1,4-benzenediamine; N-(1,4-dimethylpentyl)-N'-phenyl-1,4-benzenediamine; N-(1,3-dimethylbutyl)-N'-phenyl-1,4-benzenediamine; N-nitrosophenylhydroxylamine and salts thereof; nitric oxide; nitrobenzene; p-benzoquinone; pentaerythrityl tetrakis(3-laurylthiopropionate); dilauryl thiodipropionate; distearyl thiodipropionate; ditridecyl thiodipropionate; tetrakis[methylene 3-(3,5-di-tert-butyl-4-hydroxyphenyl)propionate]methane; thiodiethylene bis[3-(3,5-di-tert-butyl-4-hydroxyphenyl)propionate]; octadecyl-3-(3,5-di-tert-butyl-4-hydroxyphenyl) propionate; isotridecyl-3-(3,5-di-tert-butyl-4-hydroxyphenyl) propionate; N,N'-hexamethyl (3,5-di-tert-butyl-4-hydroxyhydrocinnamamide); iso-octyl-3-(3,5-di-tert-butyl-4-hydroxyphenyl) propionate; 2,2'-ethylidenebis-(4,6-di-tert-butylphenol); 1,3,5-trim ethyl-2,4,6-tris(3,5-di-tert-butyl-4-hydroxybenzyl) benzene; 4,6-bis(octylthiomethyl)-o-cresol; triethylene glycol-bis-3-(3-tert-butyl-4-hydroxy-5-methylphenyl)propionate; tris-(3,5-di-tert-butylhydroxybenzyl) isocyanurate; tris(2,4-di-tert-butylphenyl) phosphate; distearyl pentaerythritol diphosphite; bis(2,4-di-tert-butyl phenyl)pentaerythritol diphosphite; 2, 5-di-tert-amyl-hydroquinone; or isomers thereof; combinations of two or more thereof; or combinations of one or more of the above with molecular oxygen. When present, the polymerization inhibitor may be added to the curable silicone composition in an amount from 50 ppm to 1,000 ppm based on total weight of the reaction mixture used to make the radical-curable branched polyorganosiloxane (I).

Constituent (f) is a catalyst inhibitor, which is added to the reaction mixture to deactivate the hydrosilylation catalyst constituent (c) after the synthesis of the radical-curable branched polyorganosiloxane (I), and thereby stabilize the made radical-curable branched polyorganosiloxane (I). Some examples of suitable catalyst inhibitors (f) include ethylenically or aromatically unsaturated amides, acetylenic compounds such as 2-ethynyl-isopropanol, 2-ethynyl-butane-2-ol, 2-methyl-3-butyn-2-ol, 2-phenyl-3-butyn-2-ol, 3,5-dimethyl-1-hexyn-3-ol, 1-ethynyl-1-cyclohexanol, 1,5-hexadiene, 1,6-heptadiene; 3,5-dimethyl-1-hexen-1-yne; 3-ethyl-3-buten-1-yne or 3-phenyl-3-buten-1-yne; ethylenically unsaturated isocyanates; silylated acetylenic alcohols exemplified by trimethyl (3,5-dimethyl-1-hexyn-3-oxy)silane, dimethyl-bis-(3-methyl-1-butyn-oxy)silane, methylvinylbis(3-methyl-1-butyn-3-oxy)silane, and ((1,1-dimethyl-2-propynyl)oxy)trimethylsilane; unsaturated hydrocarbon diesters; conjugated ene-ynes exemplified by 2-isobutyl-1-butene-3-yne, 3,5-dimethyl-3-hexene-1-yne, 3-methyl-3-pentene-1-yne, 3-methyl-3-hexene-1-yne, 1-ethynylcyclohexene, 3-ethyl-3-butene-1-yne, and 3-phenyl-3-butene-1-yne; olefinic siloxanes such as 1,3-divinyltetramethyldisiloxane, 1,3,5,7-tetravinyltetramethyl cyclotetrasiloxane, or 1,3-divinyl-1,3-diphenyldimethyldisiloxane; 1,3,5,7-tetramethyl-1,3,5,7-tetravinylcyclotetrasiloxane; a mixture of a conjugated ene-yne as described above and an olefinic siloxane as described above; hydroperoxides; nitriles and diaziridines; unsaturated carboxylic esters exemplified by diallyl maleate, dimethyl maleate, diethyl fumarate, diallyl fumarate, and bis-2-methoxy-1-methylethylmaleate, mono-octylmaleate, mono-isooctylmaleate, mono-allyl maleate, mono-methyl maleate, mono-ethyl fumarate, mono-allyl fumarate, and 2-methoxy-1-methylethylmaleate; fumarates such as diethyl fumarate; fumarate/alcohol mixtures wherein the alcohol is benzyl alcohol or 1-octanol and ethenyl cyclohexyl-1-ol; a nitrogen-containing compound such as tributylamine, tetramethylethylenediamine, benzotriazole; a similar phosphorus-containing compound such as triphenylphosphine; a sulphur-containing compound; a hydroperoxy compound; or a combination thereof.

The catalyst inhibitor (f) is used in an amount effective to deactivate the hydrosilylation catalyst (c). The amount will vary depending on the type and amount of hydrosilylation catalyst (c) and the type of inhibitor (f) selected, however, the amount may be from 0.001 to 3 parts by weight, and alternatively from 0.01 to 1 part by weight per 100 parts by weight of constituent (I) the radical-curable branched polyorganosiloxane.

Alternatively, the method or process for making the radical-curable branched polyorganosiloxane (I), according to a second embodiment, may comprise the product of a reaction comprising: (a') a branched polyorganosiloxane having, on average, greater than two aliphatically unsaturated groups per molecule; and (b') a reactive species having, per molecule, at least one silicon-bonded hydrogen and one or more radical-curable groups selected from acrylate groups and methacrylate groups, in the presence of (c) a hydrosilylation catalyst and optionally in the presence of (d) an isomer concentration reducing agent and optionally in the presence of (e) a polymerization inhibitor, optionally followed by the addition of a catalyst inhibitor (f).

Constituents (a'), (b'), (c), and optionally (d), and (e) are blended together. The reaction may then be initiated by raising the temperature to from 35° C. to 100° C., alternatively from 50° C. to 85° C., and maintaining the temperature until all of the Si—H has reacted, as measured by the Si—H peak as observed by FT-IR at about 2170 cm$^{-1}$ being reduced into the background noise of the FT-IR spectra, which may be acquired using 32 scans each. Next, if desired the optional catalyst inhibitor (f) is added to the resulting mixture to deactivate the hydrosilylation catalyst (c). In certain embodiments, the introduction of the catalyst inhibitor (f) is done after reducing the temperature of the reaction mixture of (a'), (b'), (c), and optionally (d) and (e) below 50° C., such as at room temperature. In certain embodiments, unreacted constituents may be separated from the product by vacuum stripping at temperatures less than 100° C., alternatively less than 85° C. The made radical-curable branched polyorganosiloxane (I) may be stored for subsequent use.

Constituent (a') is a branched polyorganosiloxane having on average, per molecule, greater than two aliphatically unsaturated groups, which are capable of undergoing a hydrosilylation reaction with a silicon-bonded hydrogen group of constituent (b'). Constituent (a') may be composed of collection of the same branched polyorganosiloxane molecules. Alternatively, constituent (a) may be composed of a combination comprising two or more branched polyorganosiloxanes that differ in at least one of the following properties: structure, viscosity, degree of polymerization, and sequence.

The structure of constituent (a') as described herein is such that upon reaction with constituent (b'), the structure described above for the radical-curable branched polyorganosiloxane (I) is synthesized. Suitable polyorganosiloxanes for constituent (a') are typically commercially available, but may be manufactured by any means that would yield the structure.

The reactive species (b') includes both the silicon-bonded hydrogens (i.e., Si—H groups) and radical-curable groups in a single molecule. The reactive species (b') may be any species that can provide the radical-curable groups in the branched polyorganosiloxane. The reactive species (b') has an average, per molecule, of at least one silicon bonded hydrogen atom that is capable of undergoing an addition reaction (e.g., a hydrosilylation reaction) with an aliphatically unsaturated group of constituent (a'). Constituent (b') further comprises one or more radical-curable groups per molecule. The radical-curable groups are functional (reactive) groups that render the branched polyorganosiloxane (prepared by the process described above) radical-curable. The radical-curable groups on constituent (b') may be selected from acrylate groups and methacrylate groups and combinations thereof. Alternatively, the radical-curable groups on constituent (b') may be selected from acrylate, alkoxy, epoxy, methacrylate, and combinations thereof.

For example, constituent (b') may comprise a silane of formula: $R^5_j SiR^2_k R^1_{(4-j-k)}$; in which each of subscripts j and k independently is from 1 to 3 with the proviso that the sum of subscripts (j+k) is less than or equal to 4. Each $R^5$ is independently a hydrogen atom or a monovalent organosilicon group containing a silicon bonded hydrogen atom, each $R^2$ is independently a radical-curable group (such as a monovalent organic group containing an acrylate group and a methacrylate group), and each $R^1$ is independently a monovalent organic group free of aliphatic unsaturation. Each of $R^1$ and $R^2$ independently may be as defined above.

Alternatively, constituent (b') may be a siloxane compound of formula: $H(R^1_2SiO)_t R^1_2Si—R^3—O—COC(R')=CH_2$, wherein each $R^1$ is independently a monovalent organic group free of aliphatic unsaturation as previously described, $R^3$ is a divalent hydrocarbon having 2 to 12 carbon atoms. R' is H or $CH_3$, and the subscript t has a value from 0 to 20, alternatively 0, alternatively from 1 to 20.

Constituents (c), and optional constituents (d), (e) and (f) are the same as similarly-named constituents described in previous embodiment above.

Constituent (II) is a radical initiator. The radical initiator (II) may be a thermal radical initiator, which upon being heated generate radical species useful for initiating and continuing radical curing reactions. Thermal radical initiators include dicumyl peroxide, n-butyl 4,4'-bis(butylperoxy) valerate, 1,1-bis(t-butylperoxy)-3,3,5 trimethyl cyclohexane, di-t-butyl peroxide and 2,5-di-(t-butylperoxy)-2,5-dimethyl hexane, 1,1-bis(tert-amylperoxy)cyclohexane (Luperox® 531M80); 2,2-bis(tert-butylperoxy)butane; 2,4-pentanedione peroxide (Luperox® 224), 2,5-bis(tert-butylperoxy)-2,5-dimethylhexane (Luperox® 101), 2,5-di(tert-butylperoxy)-2,5-dimethyl-3-hexyne; 2-butanone peroxide, benzoyl peroxide, cumene hydroperoxide, di-tert-amyl peroxide (Luperox® DTA®), lauroyl peroxide (Luperox® LP), tert-butyl hydroperoxide; tert-butyl peracetate; tert-butyl peroxybenzoate; tert-butylperoxy 2-ethylhexyl carbonate; di(2,4-dichlorobenzoyl) peroxide; dichlorobenzoylperoxide (available as Varox® DCBP from R. T. Vanderbilt Company, Inc. of Norwalk, Conn., USA); di(tert-butylperoxyisopropyl)benzene, di(4-methylbenzoyl) peroxide, butyl 4,4-di(tert-butylperoxy)valerate, 3,3,5,7,7-pentamethyl-1,2,4-trioxepane; tert-butyl peroxy-3,5,5-trimethylhexanoate; tert-butyl cumyl peroxide; di(4-tert-butylcyclohexyl) peroxydicarbonate (available as Perkadox 16); dicetyl peroxydicarbonate; dimyristyl peroxydicarbonate; 2,3-dimethyl-2,3-diphenylbutane, dioctanoyl peroxide; tert-butylperoxy 2-ethylhexyl carbonate; tert-amyl peroxy-2-ethylhexanoate, tert-amyl peroxypivalate; and combinations thereof.

Examples of such thermal radical initiators are commercially available under the following trade names: Luperox® sold by Arkema, Inc. of Philadelphia, Pa., U.S.A.; Trigonox and Perkadox sold by Akzo Nobel Polymer Chemicals LLC of Chicago, Ill., U.S.A., VAZO sold by E.I. duPont deNemours and Co. of Wilmington, Del., USA; VAROX® sold by R.T. Vanderbilt Company, Inc. of Norwalk, Conn., U.S.A.; and Norox sold by Syrgis Performance Initiators, Inc. of Helena, Ark., U.S.A.

Alternatively, the curing agent may comprise a room temperature-functional radical initiator such as an organoborane-amine complex, which without being heated may generate radical species useful for initiating and continuing radical curing reactions, although optionally heating may be used. The organoborane-amine complex is a complex formed by combining an organoborane and a suitable amine that renders the complex stable at ambient conditions. The organoborane-amine complex is capable of initiating polymerization or crosslinking of constituent (I) after it has been activated by contacting the organoborane-amine complex with an amine reactive compound (described later) and/or by heating the organoborane-amine complex. An example of the organoborane-amine complexes is an alkylborane-amine complex formed from a trialkylborane and an amines. While the molar ratio of nitrogen groups per boron atom can vary in the organoborane-amine complex, the optimal molar ratio may be from 1 to 10 nitrogen-containing functional groups per B atom. Examples of trialkylboranes useful for forming the organoborane-amine complex include trialkylboranes of the formula $B—R^6_3$, where $R^6$ represents non-functional monovalent organic groups such as hydrocarbyl groups having 1 to 20 carbon atoms. The hydrocarbyl groups of $R^6$ may be linear or branched, aliphatic or aromatic. Some examples of such trialkylboranes include trimethylborane, tri-n-butylborane, tri-n-octylborane, tri-sec-butylborane, tri-dodecylborane, and phenyldiethylborane.

Some examples of amines useful for forming the organoborane-amine complex with the organoborane compounds include 1,3-propanediamine, 1,6-hexanediamine, methoxypropylamine, pyridine, and isophorone diamine. Other examples of amines useful for forming organoborane-amine complexes are described in U.S. Pat. No. 6,777,512 (the '512 patent), as well as in U.S. Pat. No. 6,806,330.

Silicon-containing amines can be used to form the organoborane-amine complex, including one or more silicon-containing amines such as 3-aminopropyltrimethoxysilane, aminomethyltrimethoxysilane, 3-aminopropyltriethoxysilane, aminomethyltriethoxysilane, 2-(trimethoxysilylethyl)pyridine, aminopropylsilanetriol, 3-(m-aminophenoxy)propyltrimethoxysilane, 3-aminopropyldiisopropylmethoxysilane, aminophenyltrimethoxysilane, 3-aminopropyltris(methoxyethoxyethoxy)silane, N-(2- aminoethyl)-3-aminopropyltrimethoxysilane, N-(2-aminoethyl)aminomethyltrimethoxysilane, N-(6-aminohexyl)aminomethyltrimethoxysilane, N-(2-aminoethyl)-11-aminoundecyltrimethoxysilane, (aminoethylaminomethyl)phenethyltrimethoxysilane, N-(2-aminoethyl)-3-aminopropylmethyldimethoxysilane, N-(2-aminoethyl)-3-aminoisobutylmethyldimethoxysilane, and (3-trimethoxysilylpropyl)diethylene-triamine.

Amine-functional polyorganosiloxanes are useful for forming the organoborane-amine complex, including one or more amine-functional polyorganosiloxanes such as amine-functional polydiorganosiloxanes and amine-functional polyorganosiloxane resins. In such aspects the amine-functional polyorganosiloxane contains at least one amine-functional group, such as 3-aminopropyl, 2-aminoethyl, aminomethyl, 6-aminohexyl, 11-aminoundecyl, 3-(N-allylamino)propyl, N-(2-aminoethyl)-3-aminopropyl, N-(2-aminoethyl)-3-aminoisobutyl, p-aminophenyl, 2-ethylpyridine, and 3-propylpyrrole.

Specific additional examples of amine-functional polyorganosiloxanes include terminal and/or pendant amine-functional polydimethylsiloxane oligomers and polymers, terminal and/or pendant amine-functional random, graft and block copolymers and co-oligomers of polydimethylsiloxane and poly(3,3,3 trifluoropropyl-methylsiloxane), terminal and/or pendant amine-functional random, graft and block copolymers and co-oligomers of polydimethylsiloxane and poly(6,6,6,5,5,4,4,3,3-nonfluorohexyl-methylsiloxane), and terminal and/or pendant amine-functional random, graft and block copolymers and co-oligomers of polydimethylsiloxane and polyphenylmethylsiloxane.

Also useful as nitrogen-containing compounds for forming the organoborane-amine complex are N-(3-triethyoxysilylpropyl)-4,5-dihydroimidazole, ureidopropyltriethoxysilane, nitrogen containing polyorganosiloxanes, and polyorganosiloxane resins in which at least one group is an imidazolyl, amidinyl, or ureido functional group. When the amine is polymeric, the molecular weight is not limited, except that it may be such a value as to maintain a sufficiently high concentration of boron in the organoborane-amine complex so as to permit curing or polymerization of the curable silicone composition thereby. For example, in a two-part curable silicone composition, the part containing the organoborane-amine complex, which is used as a radial initiator, may be diluted with other constituents of the curable silicone composition, or it may consist of the organoborane-amine complex alone.

When an organoborane-amine complex is used as the curing agent, the curable silicone composition containing same may further comprise an amine reactive compound that is capable of initiating the polymerization or crosslinking of the curable silicone composition when mixed with the organoborane amine complex and exposed to an oxygenated environment. The amine reactive compound may function as a co-catalyst in that it may activate the organoborane-amine complex, and the resulting organoborane-amine complex may initiate the polymerization or crosslinking. The presence of the amine reactive compound allows the initiation of polymerization or crosslinking to occur at temperatures below the dissociation temperature of the organoborane-amine complex, including room temperature and below. To achieve storage stability in the presence of oxygen, the organoborane-amine complex and the amine reactive compound may be physically or chemically isolated from each other. For example, a curable silicone composition containing an amine reactive compound can be rendered air stable by packaging it separately from the organoborane-amine complex as a multiple-part composition. Alternatively, the organoborane-amine complex, the amine reactive compound, or both can be encapsulated, or delivered in separate phases in the curable silicone composition. This can be accomplished by introducing one or both of the organoborane-amine complex, the amine reactive compound in a solid form that prevents intimate mixing of the organoborane-amine complex and the amine reactive compound. Curing of the curable silicone composition can be activated by (a) heating it above the softening temperature of the solid phase constituent or encapsulant of the encapsulated or separate phased organoborane-amine complex and/or amine reactive compound, or (b) by contacting the encapsulated or separate phased organoborane-amine complex and/or amine reactive compound with a solubilizing agent that allows intimate mixing of the organoborane-amine complex and the amine reactive compound. The organoborane amine complex and the amine reactive compound can also be combined in a single container without significant polymerization or crosslinking by packaging the two constituents in a container where mixing conditions are anaerobic.

Examples of some amine reactive compounds having amine reactive groups that can rapidly initiate polymerization or cure in the presence of the organoborane-amine complex and molecular oxygen include mineral acids, Lewis acids, carboxylic acids, carboxylic acid derivatives such as anhydrides and succinates, carboxylic acid metal salts, isocyanates, aldehydes, epoxides, acid chlorides, and sulphonyl chlorides. Some suitable amine reactive compounds include acrylic acid, polyacrylic acid, methacrylic acid, polymethacrylic acid, methacrylic anhydride, polymethacrylic anhydride, undecylenic acid, oleic acid, isophorone diisocyanate, methacryloylisocyanate, 2-(methacryloyloxy)ethyl acetoacetate, undecylenic aldehyde, and dodecyl succinic anhydride.

For improved compatibility in curable silicone compositions the amine reactive compound may be an organosilane or organopolysiloxane bearing amine reactive groups. Some examples include 3-isocyanatopropyltrimethoxysilane; isocyanatomethyltrimethoxysilane; 3-glycidoxypropyltrimethoxysilane; triethoxysilylpropyl succinic anhydride; propylsuccinic anhydride functionalized linear, branched, resinous, and hyperbranched organopolysiloxanes; methylsuccinic anhydride functionalized linear, branched, resinous, and hyperbranched organopolysiloxanes; cyclohexenyl anhydride functional linear, resinous, and hyperbranched organopolysiloxanes; carboxylic acid functionalized linear, branched, resinous, and hyperbranched organopolysiloxanes such as carboxydecyl terminated oligomeric or polymeric polydimethylsiloxanes; and aldehyde functionalized linear, branched, resinous, and hyperbranched organopolysiloxanes such as undecylenic aldehyde-terminated oligomeric or polymeric polydimethylsiloxanes. The U.S. Pat. No. 6,777,512 describes silicon containing compounds that can be used including certain compounds that release an acid when exposed to moisture. The U.S. Pat. No. 6,777,512 also describes other amine reactive compounds referred to as decomplexation agents. Alternatively, the decomplexation agent may be selected from acids, anhydrides, isocyanates, or epoxies. Specific examples include 3-(triethoxysilyl)propylsuccinic anhydride, nonenyl succinic anhydride, acetic acid, 2-carboxyethylacrylate, ethylene glycol methacrylate phosphate, and acrylic acid.

Alternatively, the constituent (II) the radical initiator comprises a redox reagent, which may function as an initiator for radical polymerization. The redox reagent may be a combination of a peroxide and an amine or of a peroxide and a transition metal chelate. The redox reagent is exemplified by diacyl peroxides such as benzoyl peroxide and acetyl peroxide; hydroperoxides such as cumene hydroperoxide and t-butyl hydroperoxide; ketone peroxides such as methyl ethyl ketone peroxide and cyclohexanone peroxide; dialkyl peroxides such as dicumyl peroxide and ti-t-butyl peroxide; peroxy esters such as t-butyl peroxy acetate; and combinations of thioglycerol (i.e., 3-mercaptopropane-1,2-diol) and pyrazoles and/or pyrazolones. Alternatively, the redox reagent may be exemplified by dimethylaniline, 3,5-dimethylpyrazole, thioglycerol; and combinations thereof. Examples of suitable redox reagents useful as radical initiators are generally known in the art and are exemplified as in U.S. Pat. No. 5,459,206. Other suitable peroxides are generally known in the art and are commercially available such as lauroyl peroxide (Luperox® LP from Arkema), dichlorobenzoylperoxide (Varox® DCBP from R. T. Vanderbilt Company, Inc.) and 6N tert-butyl hydroperoxide.

The concentration of the radical initiator (II) may be from 0.01% to 15%, alternatively from 0.1% to 5%, and alternatively 0.1% to 2%, based on the weight of the curable silicone composition.

Optional constituent (III) is a silicone reactive diluent. The silicone reactive diluent (III) aids in dispensing of the curable silicone composition by reducing the viscosity of the curable silicone composition to make it more flowable. Alternatively the silicone reactive diluent may function as a cure accelerator (due to its mobility in the curable silicone composition), alternatively as both the dispensing aid and a cure accelerator. Alternatively or additionally, the silicone reactive diluent can function as a crosslinker in aspects where the number of radical-curable groups per molecule (e.g., the number of $R^2$ groups per molecule) is greater than 2 in the silicone reactive diluent (III).

In certain aspects of the curable silicone composition, wherein the silicone reactive diluent (III) is present, the amount of silicone reactive diluent (III) utilized is from 0.1 to 95 weight percent, alternatively from 30 to 70 weight percent based on the total silicone matrix weight of the curable silicone composition (i.e. the total weight of constituents (I) and (III)).

The silicone reactive diluent (III) may be a monofunctional silicone reactive diluent, a polyfunctional silicone reactive diluent such as a difunctional silicone reactive diluent, or a combination thereof. The silicone reactive diluent selected will depend on various factors including the structure and number of the radical-curable groups of the radical-curable branched polyorganosiloxane (I). However, examples of radical-curable groups on the suitable silicone reactive diluents include an acrylate, an anhydride such as a maleic anhydride or methacrylic anhydride, an epoxy such as a monofunctional epoxy compound, a methacrylate such as glycidyl methacrylate, an oxetane, a vinyl acetate, a vinyl ester, a vinyl ether, a fluoro alkyl vinyl ether, a vinyl pyrrolidone such as N-vinyl pyrrolidone, a styrene, or a combination thereof.

The silicone reactive diluent (III) described above can be represented by the structure:

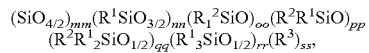

wherein each $R^1$ is independently a monovalent organic group free of aliphatic unsaturation; each $R^2$ is independently a radical-curable group as previously defined for constituent (I); each $R^3$ is independently a divalent hydrocarbon having 2 to 12 carbon atoms; subscript mm is from 0 to 5; subscript nn is from 0 to 5; with the proviso that the sum of subscripts mm+nn is from 0 to 5; subscript oo is from 0 to 400; subscript pp is from 0 to 10; subscript qq is from 0 to 10; with the proviso that the sum of subscripts pp+qq has a value of 1 or greater; subscript rr is from 0 to 10; with the proviso that the sum of subscripts qq+rr=nn+2 mm+2; and the subscript ss has a value from 1 to 20. Each of $R^1$ and $R^2$ independently may be as defined above. In some aspects the silicone reactive diluent (III) is any one of Dil1, Dil2, and Dil3 described later in the Examples.

In a first embodiment the silicone reactive diluent (III) may be a reaction product of a reaction of constituents (aa) and (b): (aa) a polyorganohydrogensiloxane having an average of greater than one silicon-bonded hydrogen atom per molecule; and (b) a reactive species having, per molecule, at least one aliphatically unsaturated organic group and one or more radical-curable groups selected from acrylate groups and methacrylate groups; in the presence of (c) a hydrosilylation catalyst and optionally in the presence of (d) an isomer concentration reducing agent and/or (e) a polymerization inhibitor, optionally followed by the addition of (f) a catalyst inhibitor. Each aliphatically unsaturated organic group for (b) may independently be as defined above for (b).

Constituents (aa), (b), (c), and optionally (d), and (e) are blended together. The reaction may then be initiated by raising the temperature to from 35° C. to 100° C., alternatively 50° C. to 85° C. while mixing, and maintaining the temperature until all of the Si—H groups have reacted, as measured by the disappearance of the Si—H peak as observed by the FT-IR at about 2170 cm$^{-1}$ being reduced into the background noise of the FT-IR spectra, which may be acquired using 32 scans each. Next, the optional catalyst inhibitor (f) is added to the resulting mixture to deactivate the hydrosilylation catalyst (c). In certain embodiments, the introduction of the catalyst inhibitor (f) is done after reducing the temperature of the reaction mixture of (aa), (b), (c), and optionally (d) and (e) below 50° C., such as at room temperature. In certain embodiments, unreacted constituents may be separated from the reaction product by vacuum stripping at temperatures from 23° C. to less than 100° C., alternatively less than 85° C. The made silicone reactive diluent (III) may be stored for subsequent use, such as in the curable silicone composition.

The polyorganohydrogensiloxane of constituent (aa) may include the silicon-bonded hydrogen atoms at the molecular terminus, or the silicon-bonded hydrogen atoms may be located in the molecular side chains (pendant). Alternatively, the silicon-bonded hydrogen atoms may be located in both the molecular side chains and terminus. The structure of constituent (aa) as described herein is such that upon reaction with constituent (b), the resulting structure will be that of the silicone reactive diluent (III) described above.

Constituent (b) is a reactive species that is as described above for reactive species (b) for making the radical-curable branched polyorganosiloxane (I) and its description is not repeated here.

The amount of constituent (b) for reaction with constituent (aa) depends on various factors including the type, amount, and Si—H content of constituent (aa) and the type of constituent (b) selected. However, the amount of constituent (b) is sufficient to make the molar ratio of silicon bonded hydrogen atoms on constituent (aa) to aliphatically unsaturated organic groups on constituent (b) is from 0.7/1 to 1.2/1, alternatively from 0.8/1 to 1.1/1.

Further details for constituents (c), and optional constituents (d), (e) and (f) are as described in previous sections pertaining to manufacture of radical-curable branched polyorganosiloxane (I) described above and are not repeated here.

In a second embodiment the silicone reactive diluent (III) may be a reaction product of a reaction of constituents (a'a') and (b'): (a'a') a polysiloxane having an average, per molecule, of greater than one aliphatically unsaturated organic group; and (b') a reactive species having, per molecule, at least one silicon-bonded hydrogen and one or more radical-curable group selected from an acrylate and methacrylate group; in the presence of (c) a hydrosilylation catalyst; and optionally in the presence of (d) an isomer concentration reducing agent and (e) a polymerization inhibitor, optionally followed by the addition of (f) a catalyst inhibitor. Each aliphatically unsaturated organic group for (a'a') may independently be as defined above for (b).

Constituents (a'a'), (b'), (c), and optionally (d), and (e) are blended together. The reaction may then be initiated by raising the temperature to from 35° C. to 100° C., alternatively from 50° C. to 85° C., and maintaining the temperature until all of the Si—H has reacted, as measured by the disappearance of the Si—H peak as observed by FT-IR at about 2170 cm$^{-1}$ being reduced into the background noise of the FT-IR spectra, which may be acquired using 32 scans each. Next, if desired the optional catalyst inhibitor (f) is added to the resulting mixture to deactivate the hydrosilylation catalyst (c). In certain embodiments, the introduction of the catalyst inhibitor (f) is done after reducing the temperature of the reaction mixture of (a'a'), (b'), (c), and optionally (d) and (e) below 50° C., such as at room temperature. In certain embodiments, unreacted constituents may be separated from the product by vacuum stripping at temperatures from 23° C. less than 100° C., alternatively less than 85° C. The made silicone reactive diluent (III) may be stored for subsequent use.

In certain embodiments, the unsaturated polyorganosiloxane of constituent (a'a') includes the unsaturated groups at the molecular terminus, while in other embodiments the unsaturated groups are located in the molecular side chains (pendant). In still other embodiments, the unsaturated groups may be located in both the molecular side chains and terminus. The structure of constituent (a'a') as described herein is such that upon reaction with constituent (b'), the resulting structure will be that of the silicone reactive diluent (III) described above.

Constituent (b') is a reactive species. The reactive species (b') may be any species that can provide the curable groups in the silicone reactive diluent (III). The reactive species has an average, per molecule, of at least one silicon bonded hydrogen (SiH group) that is capable of undergoing an addition reaction (e.g., a hydrosilylation reaction) with an aliphatically unsaturated organic group of constituent (a'a'). Constituent (b') further comprises one or more radical-curable groups per molecule. The radical-curable groups are functional (reactive) groups that render the silicone reactive diluent radical-curable. The radical-curable groups on constituent (b') may be selected from acrylate groups and methacrylate groups and combinations thereof.

The structure of constituent (b') may be the same as that described for constituent (b') used to make the radical-curable branched polyorganosiloxane (I) and is not repeated.

The amount of constituent (b') depends on various factors including the type, amount, and aliphatically unsaturated group content of constituent (a'a') and the type of constituent (b') selected. However, the amount of constituent (b') is sufficient to make the molar ratio of silicon-bonded hydrogen atoms on constituent (b') to aliphatically unsaturated organic groups on constituent (a'a') be from 0.9/1 to 1.4/1, alternatively 1/1 to 1.1/1.

Further details for constituents (c), and optional constituents (d), (e) and (f) are as described in previous sections pertaining to manufacture of radical-curable branched polyorganosiloxane (I) described above and are not repeated here.

Optional constituent (IV) fillers are exemplified by reinforcing fillers and/or extending fillers, thermally conductive fillers and/or electrically conductive fillers, flame retarding fillers, acid accepting fillers, rheologically modifying fillers, and coloring fillers. Examples include quartz, silica (e.g. fumed, ground, precipitated), calcium carbonate (e.g. fumed, ground, precipitated), non-functional silicone resin, alumina, boron nitride, silver, zinc oxide, magnesium oxide, magnesium hydroxide, aluminum trihydrate, titanium dioxide, diatomaceous earth, talc, coated fillers, carbon fibers, chopped fiber such as chopped KEVLAR®, or a combination thereof. The amount of filler (IV) in the curable silicone composition will depend on various factors including the type of filler selected and the end use of the curable silicone composition, including the desired radical-curable branched polyorganosiloxane (I) to be produced. However, the amount of filler (IV) may be up to 90% based on the combined weight of all the constituents of the curable silicone composition. For example, when the radical-curable branched polyorganosiloxane (I) is to be used in a conductive curable silicone composition, the amount of filler (IV) may be from 40% to 90% of the total weight of the curable silicone composition. Alternatively, when the radical-curable branched polyorganosiloxane (I) is to be used in an adhesive curable silicone composition, the amount of filler (IV) may be from 5% to 50% based on the combined weight of all the constituents of the adhesive curable silicone composition.

In the aspect where the filler (IV) comprises a thermally conductive filler, this filler may be both thermally conductive and electrically conductive. Alternatively, the thermally conductive filler may be thermally conductive and electrically insulating. The thermally conductive filler may be selected from the group consisting of aluminum nitride, aluminum oxide, aluminum trihydrate, barium titanate, beryllium oxide, boron nitride, carbon fibers, diamond, graphite, magnesium hydroxide, magnesium oxide, metal particulate, onyx, silicon carbide, tungsten carbide, zinc oxide, coated fillers, and a combination thereof.

The thermally conductive filler may comprise a metallic filler, an inorganic filler, a meltable filler, or a combination thereof. Metallic fillers include particles of metals and particles of metals having layers on the surfaces of the particles. These layers may be, for example, metal nitride layers or metal oxide layers. Suitable metallic fillers are exemplified by particles of metals selected from the group consisting of aluminum, copper, gold, nickel, silver, and combinations thereof, and alternatively aluminum. Suitable metallic fillers are further exemplified by particles of the metals listed above having layers on their surfaces selected from the group consisting of aluminum nitride, aluminum oxide, copper oxide, nickel oxide, silver oxide, and combinations thereof. For example, the metallic filler may comprise aluminum particles having aluminum oxide layers on their surfaces. Inorganic fillers are exemplified by onyx; aluminum trihydrate, metal oxides such as aluminum oxide, beryllium oxide, magnesium oxide, and zinc oxide; nitrides such as aluminum nitride and boron nitride; carbides such as silicon carbide and tungsten carbide; and combinations thereof. Alternatively, inorganic fillers are exemplified by aluminum oxide, zinc oxide, and combinations thereof. Meltable fillers may comprise Bi, Ga, In, Sn, or an alloy thereof. The meltable filler may optionally further comprise Ag, Au, Cd, Cu, Pb, Sb, Zn, or a combination thereof. Examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The meltable filler may have a melting point from 50° C. to 250° C. The meltable filler may be a eutectic alloy, a non-eutectic alloy, or a pure metal. Many suitable meltable fillers are commercially available.

The thermally conductive filler may be a single thermally conductive filler or a combination of two or more thermally conductive fillers that differ in at least one property. Thermally conductive fillers are generally known in the art and many are commercially available, see for example, U.S. Pat. No. 6,169,142 (col. 4, lines 7-33). The average particle size of the thermally conductive filler will depend on various factors including the type of thermally conductive filler selected and the exact amount added to the curable silicone composition, as well as the bondline thickness of the device in which the cured product of curing the curable silicone composition will be used. However, the thermally conductive filler may have an average particle size from 0.1 micrometer to 80 micrometers. The amount of the thermally conductive filler (IV) in the curable silicone composition depends on various factors including the specific thermally conductive fillers selected. However, the amount of the thermally conductive filler, if utilized, may be from 30 vol % to 80 vol %, alternatively from 40 vol % to 75 vol % by volume of the conductive curable silicone composition.

In certain aspects the filler (IV) may comprise a non-reactive silicone resin. The non-reactive silicone resin useful herein contains monofunctional units represented by $R^6_3SiO_{1/2}$ and tetrafunctional units represented by $SiO_{4/2}$. $R^6$ represents a non-functional monovalent organic group such as a hydrocarbyl group that is not curable by a radical mechanism such as an alkyl group. Suitable non-functional monovalent organic groups for $R^6$ independently are as defined above. The silicone resin is soluble in liquid hydrocarbons such as benzene, toluene, xylene, heptane and the like or in liquid organosilicon compounds such as a low viscosity cyclic and linear polydiorganosiloxanes. The molar ratio of the $R^6_3SiO_{1/2}$ to $SiO_{4/2}$ units in the non-reactive silicone resin filler (IV) may be from 0.5/1 to 1.5/1, alternatively from 0.6/1 to 0.9/1. These mole ratios are conveniently measured by Silicon 29 Nuclear Magnetic Spectroscopy ($^{29}Si$ NMR). This technique is capable of quantitatively determining the concentration of $R^6_3SiO_{1/2}$ ("M") and $SiO_{4/2}$ ("Q") units derived from the non-reactive silicone resin, in addition to the total hydroxyl content of the non-reactive silicone resin. The non-reactive silicone resin may further comprise 2.0 wt % or less, alternatively 0.7% or less, alternatively 0.3% or less, of terminal units represented by the formula $XSiO_{3/2}$, where X represents hydroxyl or a hydrolyzable group, exemplified by alkoxy such as methoxy and ethoxy, and acetoxy. The concentration of hydrolyzable groups present in the non-reactive silicone resin can be determined using FT-IR. Alternatively or additionally, the amount of Si—H may be quantitatively determined using GC Test Method 1 described later. The weight average molecular weight, $M_w$, of the non-reactive silicone resin will depend at least in part on the molecular weight of the silicone resin and the type(s) of hydrocarbyl groups, represented by $R^6$, that are present in the non-reactive silicone resin. $M_w$ as used herein represents the molecular weight measured using gel permeation chromatography (GPC), when the peak representing the neopentamer is excluded from the measurement. The $M_w$ of the non-reactive silicone resin may be from 12,000 to 30,000 g/mole, typically from 17,000 to 22,000 g/mole. The non-reactive silicone resin can be prepared by any suitable method. Silicone resins of this type have been prepared by cohydrolysis of the corresponding silanes or by silica hydrosol capping methods generally known in the art. The non-reactive silicone resin may be prepared by the silica hydrosol capping processes of Daudt, et al., U.S. Pat. No. 2,676,182; of Rivers-Farrell et al., U.S. Pat. No. 4,611,042; and of Butler, U.S. Pat. No. 4,774,310.

In certain aspects the filler constituent (IV) may comprise an acid acceptor. The acid acceptor may comprise a metal oxide such as magnesium oxide. Acid acceptors are generally known in the art and are commercially available under trade names including Rhenofit F, Star Mag CX-50, Star Mag CX-150, BLP-3, and MaxOx98LR. Rhenofit F was calcium oxide from Rhein Chemie Corporation of Chardon, Ohio, USA. Star Mag CX-50 was magnesium oxide from Merrand International Corp. of Portsmouth, N.H., USA. MagOX 98LR was magnesium oxide from Premier Chemicals LLC of W. Conshohocken, Pa., USA. BLP-3 was calcium carbonate was Omya Americas of Cincinnati, Ohio, USA.

The filler of constituent (IV) may be untreated, pretreated, or added in conjunction with an optional filler treating agent (V), which when so added may treat the filler in situ. The filler (IV) may be a single filler or a combination of two or more fillers that differ in at least one property such as type of filler, method of preparation, treatment or surface chemistry, filler particle shape, filler surface area, average particle size, or particle size distribution. The shape of filler particles is not specifically restricted. However, rounded or spherical particles may prevent undesirable levels of viscosity increase in the curable silicone composition.

Optional constituent (V) is a filler treating agent and may comprise a silane such as an alkoxysilane, an alkoxy-functional oligosiloxane, a cyclic polyorganosiloxane, a hydroxyl-functional oligosiloxane such as a dimethyl siloxane or methyl phenyl siloxane, an organosilicon compound, a stearate, or a fatty acid. The treating agent of constituent (V) may comprise a single treating agent, or a combination of two or more treating agents selected from similar or different types of molecules. The filler treating agent (V) may be a treating agent, which is generally known in the art. The amount of filler treating agent (V) may vary depending on various factors including the type and amounts of fillers selected for constituent (IV), and whether the filler (IV) is treated with filler treating agent (V) in situ or pretreated before being combined with other constituents of the curable silicone composition. However, the curable silicone composition may comprise an amount from 0.1 wt % to 2 wt % of optional filler treating agent (V), based on the weight of the filler for constituent (IV).

The filler treating agent (V) may comprise of alkoxysilanes. The alkoxysilane may have the formula: $R^7_u Si(OR^8)_{(4-u)}$, where subscript u is 1, 2, or 3; alternatively u is 1. Each $R^8$ is independently a saturated monovalent hydrocarbon of 1 to 4 carbon atoms, alternatively 1 to 2 carbon atoms. Each $R^7$ is independently a monovalent organic group of 1 to 50 carbon atoms, such as a monovalent hydrocarbon group (i.e., a hydrocarbyl group) of 1 to 50 carbon atoms, alternatively 6 to 18 carbon atoms. Suitable monovalent hydrocarbon groups for $R^7$ are exemplified by alkyl groups and aryl groups such as ($C_5$-$C_{50}$)alkyl groups or ($C_5$-$C_{20}$)alkyl groups such as hexyl, octyl, dodecyl, tetradecyl, hexadecyl, and octadecyl; and ($C_6$-$C_{20}$)aryl groups such as aromatic groups such as benzyl, phenyl and phenylethyl. $R^7$ can be a monovalent hydrocarbon group that is saturated or unsaturated and branched or unbranched. Alternatively, $R^7$ can be a saturated, unbranched, monovalent hydrocarbon group. In some aspects each $R^7$ independently is as defined above for $R^1$. Alkoxysilane filler treating agents (V) are exemplified by hexyltrimethoxysilane, octyltriethoxysilane, decyltrimethoxysilane, dodecyltrimethoxysilane, tetradecyltrimethoxysilane, phenyltrimethoxysilane, phenylethyltrimethoxysilane, octadecyltrimethoxysilane, octadecyltriethoxysilane, and a combination thereof. In certain aspects the alkoxysilane(s) may be used in combination with silazanes, which catalyze the less reactive alkoxysilane reaction with surface hydroxyls. Such reactions are typically performed above 100° C. with high shear with the removal of volatile by-products such as ammonia, methanol and water.

Filler treating agents (V) for thermally conductive fillers, such as alumina or passivated aluminum nitride, may include alkoxysilyl functional alkylmethyl polysiloxanes (e.g., partial hydrolysis condensate of formula: $R^9_v R^7_w Si(OR^8)_{(4-v-w)}$, or cohydrolysis condensates or mixtures), or similar materials where the hydrolyzable group may comprise silazane, acyloxy or oximo. In all of these, a group tethered to Si, such as $R^9$ in the formula above, is a long chain unsaturated monovalent hydrocarbon or monovalent aromatic hydrocarbon. Each $R^7$ is independently a monovalent hydrocarbon group, and each $R^8$ is independently a saturated monovalent hydrocarbon group of 1 to 4 carbon atoms. In the formula above, subscript v is 1, 2, or 3 and subscript w is 0, 1, or 2, with the proviso that the sum of subscripts (v+w) is 1, 2, or 3.

Alkoxy-functional oligosiloxanes can also be used as filler treating agents (V). Alkoxy-functional oligosiloxanes and methods for their preparation are generally known in the art, see for example, EP 1101167A2. Other filler treating agents include mono-endcapped alkoxy functional polydiorganosiloxanes, i.e., polyorganosiloxanes having alkoxy functionality at one end and may be exemplified by the formula: $R^{10}R^1_2SiO(R^1_2SiO)_xSi(OR^8)_3$, where subscript x has a value of 0 to 150, alternatively 20 to 100. Each $R^{10}$ is independently selected from an alkyl group, such as methyl, ethyl, propyl, butyl, hexyl, and octyl; and an alkenyl group, such as vinyl, allyl, butenyl, and hexenyl. Each $R^1$ is independently a monovalent organic group free of aliphatic unsaturation, such as $R^1$ described above, and each $R^8$ is as previously described. In an example, each $R^{10}$, each $R^1$, and each $R^8$ is methyl. In an alternative example, each $R^{10}$ is vinyl, and each $R^1$ and each $R^8$ is methyl.

Alternatively, the filler treating agent (V) can be any of the organosilicon compounds typically used to treat silica fillers. Examples of organosilicon compounds include organochlorosilanes such as methyltrichlorosilane, dimethyldichlorosilane, and trimethyl monochlorosilane; organosiloxanes such as hydroxy-endblocked dimethylsiloxane oligomer, hexamethyldisiloxane, and tetramethyldivinyldisiloxane; organosilazanes such as hexamethyldisilazane and hexamethylcyclotrisilazane; and organoalkoxysilanes such as methyltrimethoxysilane, $C_6H_{13}Si(OCH_3)_3$, $C_8H_{17}Si(OC_2H_5)_3$, $C_{10}H_{21}Si(OCH_3)_3$, $C_{12}H_{25}Si(OCH_3)_3$, $C_{14}H_{29}Si(OC_2H_5)_3$, and $C_6H_5CH_2CH_2Si(OCH_3)_3$, vinyltrimethoxysilane, vinyltriethoxysilane, 3-glycidoxypropyltrimethoxysilane, and 3-methacryloxypropyltrimethoxysilane.

Alternatively, a polyorganosiloxane is useful as a treating agent (V). The use of such a treating agent to treat the surface of the filler (IV) takes advantage of multiple hydrogen bonds, either clustered or dispersed or both, as the means to tether the polyorganosiloxane to the filler surface. The polyorganosiloxane capable of hydrogen bonding has an average, per molecule, of at least one silicon-bonded group capable of hydrogen bonding. The group may be selected from: a monovalent organic group having multiple hydroxyl functionalities or a monovalent organic group having at least one amino functional group. Hydrogen bonding may be a primary mode of bonding of the polyorganosiloxane to the filler (IV). The polyorganosiloxane may be incapable of forming covalent bonds with the filler (IV). The polyorganosiloxane capable of hydrogen bonding may be selected from the group consisting of a saccharide-siloxane polymer, an amino-functional polyorganosiloxane, and a combination thereof. Alternatively, the polyorganosiloxane capable of hydrogen bonding may be a saccharide-siloxane polymer.

Alternative treating agents (V) that are suited to treat metal fillers may consist of alkylthiols such as octadecyl mercaptan and others, and fatty acids such as oleic acid, stearic acid, titanates, titanate coupling agents, zirconate coupling agents, and a combination thereof. One skilled in the art could optimize a specific treatment to aid dispersion of the filler without undue experimentation.

The process for introducing the fillers (IV) and filler treating agents (V) described herein may, in a first embodiment, comprises mixing the filler constituent (IV) and optional filler treating agent (V) with constituent (I) or constituent (III), or alternatively with constituents (I) and (III) combined. The above process for adding the optional filler (IV) and filler treating agent (V) may provide a benefit by avoiding or mitigating adverse reactions with branched polyorganosiloxanes (for example, containing hydrolyzable groups). The occurrence and extent of such adverse reactions may depend on the filler selection and type of treatment desired, and their occurrence may be problematic and lead to instability of product.

In a second embodiment, the process for introducing the fillers (IV) and filler treating agents (V) described herein may further comprise mixing the filler (IV) and optional filler treating agent (V) with constituent (a), (a1) or (a') used to make constituent (I) or mixing the filler (IV) and optional filler treating agent (V) with constituent (aa) or (a'a') used to make constituent (III). In this embodiment, filler treatment can take place in situ either before or after other constituents needed for synthesis of constituents (I), (III) or (I) and (III) combined are added (either prior to introduction of radical-curable functionality or after introduction of radical-curable functionality). The effective treatment of filler surfaces in situ as described above may in certain aspects be done at elevated temperature and/or under vacuum conditions. In some instances elevated temperatures may be undesirable with thermally sensitive unsaturated functional groups (e.g., radical-curable groups).

In a third embodiment, the process for introducing the fillers (IV) and filler treating agents (V) described herein may further comprise mixing the filler (IV) and optional filler treating agent (V) with constituent (a), (a1) or (a') used to make constituent (I) or mixing the filler (IV) and optional filler treating agent (V) with constituent (aa) or (a'a') used to make constituent (III). In this third embodiment, filler treatment can take place before other constituents needed for synthesis of constituents (I), (III) or (I) and (III) combined are added (prior to introduction of radical-curable functionality). Therefore before such mixing, the filler (IV) may be pretreated with the filler treating agent (V) in the presence of constituent (a), (a1), (a'), (aa) or (a'a') at elevated temperature and/or under vacuum. Preferably, the filler (IV) may be pretreated with the filler treating agent (V) in the presence of constituent (a1), (a'), or (a'a') at elevated temperature and/or under vacuum. These filler treating conditions may be performed in a batch or continuous process as described, for example, in U.S. Pat. No. 6,013,701. The treatment of filler (IV) with treating agent (V) may take place in situ with other constituents added after completion of treatment. Alternatively, the filler treatment may take place off-line to make a combination of treated filler in polyorganosiloxane. This intermediate product can then be used to provide the level of constituent (a1), (a'), or (a'a') desired for the synthesis of constituent (I), (III), or (I) and (III) combined. The resulting combination of treated filler in the polyorganosiloxane (a1), (a'), or (a'a') is referred to as a masterbatch. Masterbatches are commercially available. The use of masterbatches allows the smooth reaction of the aliphatically unsaturated organic groups of constituents (a1), (a'), or (a'a') with the silicon bonded hydrogen atoms of constituents (a2) or (b'), as described in process embodiments for forming constituents (I) and (III), to be performed in a single, low shear step. The described method may lead to filled radical-curable branched polyorganosiloxanes (I) with superior tensile and adhesive properties along with improved rheological and storage properties.

The curable silicone composition may optionally include any one or more of (VI) a condensation cure initiator, (VII) a crosslinker, and (VIII) a condensation curable resin or polymer or combination thereof.

Optional constituent (VI) is a moisture cure initiator (i.e. a condensation catalyst or condensation reaction catalyst). Examples of condensation reaction catalysts are generally known in the art and are disclosed in U.S. Pat. Nos. 4,962,076; 5,051,455; 5,053,442; 4,753,977 at col. 4, line 35 to col. 5, line 57; and 4,143,088 at col. 7, line 15 to col. 10, line 35. The amount of the condensation reaction catalyst used depends on various factors including the type of catalyst selected and the choice of the remaining constituents in the curable silicone composition, however the amount of the condensation reaction catalyst may be from 0.001% to 5% based on the weight of the curable silicone composition.

Suitable condensation reaction catalyst (VI) may be a Lewis acid; a primary, secondary, or tertiary organic amine; a metal oxide; a titanium compound; a tin compound; a zirconium compound; or a combination thereof. The condensation reaction catalyst may comprise a carboxylic acid salt of a metal selected from lead to manganese inclusive in the electromotive series of metals. Alternatively, the condensation reaction catalyst may comprise a chelated titanium compound, a titanate such as a tetraalkoxytitanate, a titanium ester, or a combination thereof. Examples of suitable titanium compounds include diisopropoxytitanium bis(ethylacetoacetate), tetrabutoxy titanate, tetrabutyltitanate, tetraisopropyltitanate, and bis-(ethoxyacetoacetonate)diisopropoxy titanium (VI), and a combination thereof. Alternatively the condensation reaction catalyst may comprise a tin compound such as dibutyltin diacetate; dibutyltin dilaurate; dibutyl tin oxide; stannous octoate; tin oxide; a titanium ester, such as tetrabutyl titanate, tetraethylhexyl titanate and tetraphenyl titanate; a siloxytitanate, such as tetrakis(trimethylsiloxy)titanium and bis(trimethylsiloxy)-bis(isopropoxy)titanium; and a betadicarbonyltitanium compound, such as bis(acetylacetonyl)diisopropyl titanate; or a combination thereof. Alternatively, the condensation reaction catalyst may comprise an amine, such as hexylamine; or an acetate or quaternary salt of an amine (e.g., a tetraalkylammonium hydroxide).

Optional constituent (VII) is a crosslinker for moisture cure. The type and amount of crosslinker will depend on various factors including the type and amount of curable groups based on the curable silicone composition.

In certain aspects, the crosslinker (VII) is a condensation reaction crosslinker that may be selected from, for example, trialkoxysilanes exemplified by propyltrimethoxysilane, phenyltrimethoxysilane, glycidoxypropyltrimethoxysilane, ethyltrimethoxysilane, aminopropyltrimethoxysilane, aminoethylaminopropyltrimethoxysilane, methyltrimethoxysilane, phenyl trimethoxysilane, and methyltriethoxysilane; acetoxysilanes such as methyltriacetoxysilane or ethyltriacetoxysilane; ketoximosilanes such as methyltri(methylethylketoximo)silane, tetra(methylethylketoximo)silane, methyltris(methylethylketoximo)silane, and vinyltris(methylethylketoximo) silane; alkyl orthosilicates such as tetraethyl orthosilicate, tetramethoxysilane, tetraethoxysilane, and condensation products of these orthosilicates, which are typically referred to as alkyl polysilicates; methylvinyl bis(n-methylacetamido) silane; and a combination thereof.

When used, the amount of crosslinker (VII) utilized in the curable silicone composition is dependent upon numerous factors, but is based primarily upon the type and amount of curable groups contained in constituents (I) and (III). However, the amount of crosslinker may vary from 0.1 to 10 weight percent, based upon the total weight of the curable silicone composition.

Optional constituent (VIII) is a moisture cure resin or polymer or combination thereof. This constituent may be used in conjunction with optional constituents (VI) and (VII) to provide a secondary cure mechanism to the curable silicone composition, which has a primary cure mechanism that is radical curable, thus overcoming potential surface tack caused by oxygen inhibition of exposed surfaces of basic aspects of the (radical-)curable silicone composition.

Constituent (VIII) may comprise an alkoxy functional silicone resin comprising $R^{11}{}_y R^6{}_{(3-y)} SiO_{1/2}$ units and $SiO_{4/2}$ units, wherein subscript y is from >0 to <3. Each $R^6$ is independently a non-functional monovalent organic group that is not curable by a radical mechanism such as a hydrocarbyl group such as $R^6$ as described above such as an alkyl group, and each $R^{11}$ is a monovalent organosilicon group containing one or more silicon-bonded alkoxy groups. The structure of $R^{11}$ may be represented by the formula $-R^3 R^6{}_h Si(OR^8)_{(3-h)}$, where subscript h is 0, 1, or 2. Each $R^8$ is a saturated monovalent hydrocarbon group of 1 to 4 carbon atoms, and $R^3$ is a divalent hydrocarbon having 2 to 12 carbon atoms. The mole ratio of the $R^{11}{}_y R^6{}_{(3-y)} SiO_{1/2}$ units to $SiO_{4/2}$ units of the resin has a value of from 0.5/1 to 1.5/1. The resin of constituent (VIII) preferably has a weight average molecular weight Mw from 12,000 to 30,000 g/mole.

Constituent (VIII) may alternatively comprise an organosiloxane polymer containing greater than 2 silicon-bonded alkoxy groups. An example of a suitable structure for this polymer may be represented by the formula $R^{11}(R^6{}_2Si)(R^6{}_2SiO)_z(R^6{}_2Si)R^{11}$, wherein each $R^6$ is independently a non-functional monovalent organic group that is not curable by a radical mechanism such as a hydrocarbyl group such as $R^6$ as described above such as an alkyl group, and each $R^{11}$ is a monovalent organosilicon group containing one or more silicon-bonded alkoxy groups as previously described. Subscript z is from 40 to 100, alternatively z is between 40 and 1000.

Constituent (VIII) may comprise the resin structure, the polymer structure, or a combination of the resin and polymer structures described above. In certain embodiments, the weight ratio of the resin to the polymer in constituent (VIII) may vary from 25/75 to 65/35. Examples of moisture curable resin and polymer structures of utility for constituent (VIII) are further described in WO 2014124364. Methods by which the moisture curable resin and polymer of constituent (VIII) may be prepared are also described in WO 2014124364, specifically those methods that do not use fumed silica filler. In aspects where optional constituent (VIII) is used, the level of resin, polymer, or combination thereof may be from 5 to 50 weight percent of the total silicone matrix weight of the curable silicone composition (i.e. the total weight of constituents (I) and (III)).

The curable silicone composition may optionally further comprise one or more additional constituents. The additional constituents are exemplified by (IX) an adhesion promoter, (X) a reactive organic monomer (or oligomer), (XI) a polymerization inhibitor, (XII) a colorant, (XIII) a solvent, (XIV) a corrosion inhibitor, and any combination thereof.

Optional constituent (IX) is an adhesion promoter. Adhesion promoters are extensively discussed in the art. Examples of suitable adhesion promoters include alkoxysilanes such as epoxy-functional alkoxysilanes, methacrylate functional alkoxysilanes, or mercapto-functional alkoxysilanes; a combination of an alkoxysilane and a hydroxy-functional polyorganosiloxane; a mercapto-functional compound; an acrylate or methacrylate functional compound; an unsaturated compound; an epoxy-functional silane; an epoxy-functional siloxane; a combination, such as a reaction product, of an epoxy-functional silane or epoxy-functional siloxane and a hydroxy-functional polyorganosiloxane; or a combination thereof. Suitable adhesion promoters are generally known in the art and are commercially available. For example, Silquest® A186 is beta-(3,4-epoxycyclohexyl)ethyltrimethoxysilane which is commercially available from Crompton OSi Specialties of Middlebury, Conn., USA. CD9050 is a monofunctional acid ester useful as an adhesion promoter that provides adhesion to metal substrates and is designed for radical-curable compositions. CD9050 is commercially available from Sartomer Co. SR489D is tridecyl acrylate, SR395 is isodecyl acrylate, SR257 is stearyl acrylate, SR506 is isobornyl acrylate, SR833S is tricyclodecane dimethanol diacrylate, SR238 is 1,6-hexanediol diacrylate, and SR351 is trimethylol propane triacrylate, all of which are also commercially available from Sartomer Company. The amount of adhesion promoter added to the curable silicone composition depends on various factors including the specific adhesion promoter selected, the other constituents of the curable silicone composition, and the end use of the curable silicone composition. Typically, the amount may be from 0.1% to 5% based on the weight of the curable silicone composition. Other suitable adhesion promoters, which are useful to promote adhesion to metals, include maleic anhydride, methacrylic anhydride, and glycidyl methacrylate.

Constituent (IX) can be an unsaturated or epoxy-functional compound. Suitable epoxy-functional compounds are generally known in the art and commercially available, see for example, U.S. Pat. Nos. 4,087,585; 5,194,649; 5,248,715; and 5,744,507 (at col. 4-5). Constituent (IX) may comprise an unsaturated or epoxy-functional alkoxysilane. For example, the functional alkoxysilane can have the formula: $R^{12}{}_u Si(OR^8)_{(4-u)}$, where subscript u is 1, 2, or 3, alternatively u is 1. Each $R^8$ is independently an unsubstituted, saturated hydrocarbyl group of 1 to 4 carbon atoms, alternatively 1 to 2 carbon atoms. $R^8$ is exemplified by methyl, ethyl, propyl, and butyl. Each $R^{12}$ is independently a monovalent organic group, such as independently described for $R^1$ above, with the proviso that at least one $R^{12}$ is an unsaturated organic group or an epoxy-functional organic group. Epoxy-functional organic groups for $R^{12}$ are exemplified by 3-glycidoxypropyl and (epoxycyclohexyl) ethyl. Unsaturated organic groups for $R^{12}$ are exemplified by 3-methacryloyloxypropyl, 3-acryloyloxypropyl, and unsaturated monovalent hydrocarbon groups such as vinyl, allyl, hexenyl, undecylenyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trim ethoxysilane, 3-acryloyloxypropyl triethoxysilane, and combinations thereof. Alternatively, examples of suitable adhesion promoters include glycidoxypropyltrimethoxysilane and a combination of glycidoxypropyltrimethoxysilane with an aluminum chelate or zirconium chelate.

Constituent (IX) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. Constituent (IX) may comprise a combination of an epoxy-functional alkoxysilane and an epoxy-functional siloxane. For example, constituent (IX) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylvinyl/dimethylsiloxane copolymer. When used as a physical blend rather than as a reaction product, these constituents may be stored separately in multiple-part kits.

Suitable mercapto-functional compounds include an organomercaptan, a mercapto containing silane, or a combination thereof. Suitable mercapto containing silanes include 3-mercaptopropyltrimethoxysilane. Suitable mercapto-functional compounds are disclosed in U.S. Pat. No. 4,962,076. One skilled in the art would recognize that certain constituents described herein may be added to the curable silicone composition for more than one or different purposes. For example, alkoxysilanes may be used as adhesion promoters, filler treating agents, and/or as crosslinking agents in condensation reaction curable silicone compositions. Additionally for example, mercapto-functional compounds described as adhesion promoters herein may alternatively be used, in addition to or instead of, filler treating agents (V).

Optional constituent (X) is a reactive organic monomer (or oligomer) that is different from the silicone reactive diluent (III) previously described. Constituent (X) may be a reactive organic monomer (or oligomer) that reacts with a functional group on the radical-curable branched polyorganosiloxane (I) and/or on the silicone reactive diluent (III). The reactive organic constituent (X) may be a monofunctional reactive constituent, a difunctional reactive constituent, a polyfunctional reactive constituent, or a combination thereof. The selection of the reactive organic monomer (or oligomer) (X) will depend on various factors including the radical-curable groups on constituent (I) and optionally curable groups on optional constituent (III). However, examples of suitable reactive monomer (or oligomer) constituents include an acrylate, an anhydride such as a maleic anhydride or methacrylic anhydride, an epoxy such as a monofunctional epoxy compound, a methacrylate such as glycidyl methacrylate, an oxetane, a vinyl acetate, a vinyl ester, a vinyl ether, a fluoro alkyl vinyl ether, a vinyl pyrrolidone such as N-vinyl pyrrolidone, a styrene, or a combination thereof.

Mono-functional acrylate and methacrylate esters are commercially available from companies such as Sartomer, Rohm Haas, Hitachi Chemical, Arkema, Inc., Cytec, Sans Ester Corp, Rahn, and Bomar Specialties Co. Specific examples include methyl acrylate; methyl methacrylate; ethyl acrylate; ethyl methacrylate; butyl acrylate; butyl methacrylate; cyclohexyl acrylate; hexyl acrylate; 2-ethylhexyl acrylate; isodecyl methacrylate; isobornyl methacrylate; hydroxyethyl methacrylate; hydroxypropyl acrylate; hydroxypropyl methacrylate; n-octyl acrylate; cyclohexyl methacrylate; hexyl methacrylate; 2-ethylhexyl methacrylate; decyl methacrylate; dodecyl methacrylate; lauryl acrylate; tert-butyl methacrylate; acrylamide; N-methyl acrylamide; diacetone acrylamide; N-tert-butyl acrylamide; N-tert-octyl acrylamide; N-butoxyacrylamide; gamma-methacryloxypropyl trimethoxysilane; dicyclopentadienyloxyethyl methacrylate; 2-cyanoethyl acrylate; 3-cyanopropyl acrylate; tetrahydrofurfuryl methacrylate; tetrahydrofurfuryl acrylate; glycidyl acrylate; acrylic acid; methacrylic acid; itaconic acid; glycidyl methacrylate; 1,12-dodecanediol dimethacrylate; 1,3-butylene glycol diacrylate; 1,3-butylene glycol dimethacrylate; 1,3-butylene glycol dimethacrylate; 1,4-butanediol diacrylate; 1,4-butanediol dimethacrylate; 1,4-butanediol dimethacrylate; 1,6-hexanediol diacrylate; 1,6-hexanediol dimethacrylate; alkoxylated cyclohexane dimethanol diacrylate; alkoxylated hexanediol diacrylate; alkoxylated neopentyl glycol diacrylate; cyclohexane dimethanol diacrylate; cyclohexane dimethanol dimethacrylate; diethylene glycol diacrylate; diethylene glycol dimethacrylate; dipropylene glycol diacrylate; ethoxylated bisphenol a diacrylate; ethoxylated bisphenol a dimethacrylate; ethylene glycol dimethacrylate; neopentyl glycol diacrylate; neopentyl glycol dimethacrylate; polypropylene glycoldimethacrylate; propoxylated neopentyl glycol diacrylate; propoxylated neopentyl glycol diacrylate; tricyclodecane dimethanol diacrylate; triethylene glycol diacrylate; trim ethylolpropane triacrylate; trimethylolpropane trimethacrylate; tris (2-hydroxy ethyl) isocyanurate triacrylate; tris (2-hydroxy ethyl) isocyanurate triacrylate; N,N'-m-phenylenedimaleimide; triallyl cyanurate; triallyl isocyanurate; metallic diacrylate; metallic dimethacrylate; metallic monomethacrylate; metallic diacrylate (difunctional); metallic dimethacrylate (difunctional); triethoxysilylpropyl methacrylate; tributoxysilylpropyl methacrylate; dimethoxymethylsilylpropyl methacrylate; diethoxymethylsilylpropyl methacrylate; dibutoxymethylsilylpropyl methacrylate; diisopropoxymethylsilylpropyl methacrylate; dimethoxysilylpropyl methacrylate; diethoxysilylpropyl methacrylate; dibutoxysilylpropyl methacrylate; diisopropoxysilylpropyl methacrylate; trimethoxysilylpropyl methacrylate; triethoxysilylpropyl acrylate; tributoxysilylpropyl acrylate; dimethoxymethylsilylpropyl acrylate; diethoxymethylsilylpropyl acrylate; dibutoxymethylsilylpropyl acrylate; diisopropoxymethylsilylpropyl acrylate; dimethoxysilylpropyl acrylate; diethoxysilylpropyl acrylate; dibutoxysilylpropyl acrylate; and diisopropoxysilylpropyl acrylate.

Examples of suitable vinyl ethers include butanediol divinyl ether, cyclohexanedimethanol divinyl ether, cyclohexanedimethanol monovinyl ether, cyclohexyl vinyl ether, diethyleneglycol divinyl ether, diethyleneglycol monovinyl ether, dodecyl vinyl ether, ethyl vinyl ether, hydroxybutyl vinyl ether, isobutyl vinyl ether, isopropyl vinyl ether, n-butyl vinyl ether, n-propyl vinyl ether, octadecyl vinyl ether, triethyleneglycol divinyl ether, and combinations thereof. Vinyl ethers are generally known in the art and commercially available from BASF AG of Germany, Europe.

The amount of constituent (X) depends on various factors such as the specific reactive constituent selected, but the amount may be from 0.5 to 50% based on the weight of curable silicone composition. One skilled in the art would recognize that some of the reactive constituents described herein (such as the difunctional and polyfunctional acrylates and methacrylates) may be used in addition to, or instead of, the reactive species described above as constituent (b) of the method of making constituent (I). Alternatively, one skilled in the art would recognize that some of the reactive constituents described herein may also function as adhesion promoters.

Optional constituent (XI) is a polymerization inhibitor. Examples of suitable polymerization inhibitors for acrylate and methacrylate radical-curable groups include: 2,6-Di-tert-butyl-4-(dimethylaminomethyl)phenol (DBAP), hydroquinone (HQ); 4-methoxyphenol (MEHQ); 4-ethoxyphenol; 4-propoxyphenol; 4-butoxyphenol; 4-heptoxyphenol; butylated hydroxytoluene (BHT); hydroquinone monobenzyl ether; 1,2-dihydroxybenzene; 2-methoxyphenol; 2,5-dichlorohydroquinone; 2,5-di-tert-butylhydroquinone; 2-acetylhydroquinone; hydroquinone monobenzoate; 1,4-dimercaptobenzene; 1,2-dimercaptobenzene; 2,3,5-trimethylhydroquinone; 4-aminophenol; 2-aminophenol; 2-N,N-dimethylaminophenol; 2-mercaptophenol; 4-mercaptophenol; catechol monobutyl ether; 4-ethylaminophenol; 2,3-dihydroxyacetophenone; pyrogallol-1,2-dimethylether; 2-methylthiophenol; t-butyl catechol; di-tert-butylnitroxide; di-tert-amylnitroxide; 2,2,6,6-tetramethyl-piperidinyloxy; 4-hydroxy-2,2,6,6-tetramethyl-piperidinyloxy; 4-oxo-2,2,6,6-tetramethyl-piperidinyloxy; 4-dimethylamino-2,2,6,6-tetramethyl-piperidinyloxy; 4-amino-2,2,6,6-tetramethyl-piperidinyloxy; 4-ethanoloxy-2,2,6,6-tetramethyl-piperidinyloxy; 2,2,5,5-tetram ethyl-pyrrolidinyloxy; 3-amino-2,2,5,5-tetramethyl-pyrrolidinyloxy; 2,2,5,5-tetramethyl-1-oxa-3-azacyclopentyl-3-oxy; 2,2,5,5-tetramethyl-3-pyrrolinyl-1-oxy-3-carboxylic acid; 2,2,3,3,5,5,6,6-octamethyl-1,4-diazacyclohexyl-1,4-dioxy; salts of 4-nitrosophenolate; 2-nitrosophenol; 4-nitrosophenol; copper dimethyldithiocarbamate; copper diethyldithiocarbamate; copper dibutyldithiocarbamate; copper salicylate; methylene blue; iron; phenothiazine (PTZ); 3-oxophenothiazine; 5-oxophenothiazine; phenothiazine dimer; 1,4-benzenediamine; N-(1,4-dimethylpentyl)-N'-phenyl-1,4-benzenediamine; N-(1,3-dimethylbutyl)-N'-phenyl-1,4-benzenediamine; N-nitrosophenylhydroxylamine and salts thereof; nitric oxide; nitrobenzene; p-benzoquinone; pentaerythrityl tetrakis(3-laurylthiopropionate); dilauryl thiodipropionate; distearyl thiodipropionate; ditridecyl thiodipropionate; tetrakis[methylene 3-(3,5-di-tert-butyl-4-hydroxyphenyl)propionate]methane; thiodiethylene bis[3-(3,5-di-tert-butyl-4-hydroxyphenyl)propionate]; octadecyl-3-(3,5-di-tert-butyl-4-hydroxyphenyl) propionate; isotridecyl-3-(3,5-di-tertbutyl-4-hydroxyphenyl) propionate; N,N'-hexamethyl (3,5-di-tert-butyl-4-hydroxyhydrocinnamamide); iso-octyl-3-(3,5-di-tert-butyl-4-hydroxyphenyl) propionate; 2,2'-ethylidenebis-(4,6-di-tert-butylphenol); 1,3,5-trim ethyl-2,4,6-tris(3,5-di-tert-butyl-4-hydroxybenzyl) benzene; 4,6-bis(octylthiomethyl)-o-cresol; triethylene glycol-bis-3-(3-tert-butyl-4-hydroxy-5-methylphenyl)propionate; tris-(3,5-di-tert-butylhydroxybenzyl) isocyanurate; tris(2,4-di-tert-butylphenyl) phosphate; distearyl pentaerythritol diphosphite; bis(2,4-di-tert-butyl phenyl)pentaerythritol diphosphite; 2, 5-di-tert-amyl-hydroquinone; or isomers thereof; combinations of two or more thereof; or combinations of one or more of the above with molecular oxygen. When present, the polymerization inhibitor may be added to the curable silicone composition in an amount from 100 ppm to 4,000 ppm. Polymerization inhibitors are generally known in the art and are disclosed, for example in patent EP 1 359 137.

Optional constituent (XII) is a colorant (e.g., dye or pigment). Examples of suitable colorants include carbon black, Stan-Tone 40SP03 Blue (which is commercially available from PolyOne) and Colorant BA 33 Iron Oxide pigment (which is commercially available from Cathay Pigments (USA), Inc. Valparaiso, Ind. 46383 USA). Examples of colorants are generally known in the art and are disclosed in U.S. Pat. Nos. 4,962,076; 5,051,455; and 5,053,442. The amount of colorant added to the curable silicone composition depends on various factors including the other constituents of the curable silicone composition, and the type of colorant selected, however, the amount of colorant (XII) may be from 0.001% to 20% based on the weight of the curable silicone composition.

Optional constituent (XIII) is a solvent. Suitable solvents are exemplified by organic solvents such as toluene, xylene, acetone, methyl ethyl ketone, methyl isobutyl ketone, hexane, heptane, alcohols such as decyl alcohol or undecyl alcohol, and a combination thereof; and non-crosslinkable silicone solvents such as trimethylsiloxy-terminated polydimethylsiloxanes, trimethylsiloxy-terminated polymethylphenylsiloxanes, and a combination thereof. Examples of silicone solvents are generally known in the art and are commercially available, for example, as Dow Corning® OS Fluids from Dow Corning Corporation of Midland, Mich., U.S.A. The amount of optional constituent (XIII) may be from 0.001% to 90% based on the weight of the curable silicone composition.

Optional constituent (XIV) is a corrosion inhibitor. Examples of suitable corrosion inhibitors include benzotriazole, mercaptabenzotriazole, mercaptobenzothiazole, and commercially available corrosion inhibitors such as 2,5-dimercapto-1,3,4-thiadiazole derivative (CUVAN® 826) and alkylthiadiazole (CUVAN® 484) from R. T. Vanderbilt. The amount of constituent (XIII) may be from 0.05% to 0.5% based on the weight of the curable silicone composition.

The curable silicone composition described herein may be used in various applications exemplified by sealant applications (e.g. assembly sealant, thermally conductive sealant, automotive lid seal, microelectronics lid seal, or terminal sealant), adhesive applications (such as low-temperature-cure adhesive for general use, die attach adhesive, or thermally conductive adhesive), or encapsulation.

The curable silicone composition described herein may be used to prepare an inventive cured silicone via curing same. The curable silicone composition and the cured silicone prepared by curing the curable silicone composition are useful in electronics applications, including both microelectronics and macroelectronics applications as well as optoelectronics applications and thermally conductive electronics applications, such as making thermally conductive adhesives. Cured silicone adhesives prepared from such a curable silicone composition may adhere to various substrates, including glass, metals such as aluminum, copper, and electroless nickel; as well as polymeric substrates such as FR4, Nylon, polycarbonate, Lucite (which is polymethylmethacrylate, PMMA), polybutylene terephthalate (PBT), and Solvay liquid crystal polymers.

The following test methods may be used to characterize the materials.

Cure Onset Time at 85° C. Test Method: Measured using a commercially-available moving die rheometer model MDR-2000 from Alpha Technologies. In this test a pre-weighed uncured sample is placed in a preheated die and is subjected to controlled strain oscillatory stress. The torque required to maintain the oscillation is measured, this value increases over time as the material cures and hardens. Test condition was set at 85° C. and 14% strain. Cure onset speed was defined for comparative purposes as the time (in minutes) required for a composition to cure and harden to a point where it registers a torque of 0.5 pound-inch (lb-in; 0.06 Newton-meter (N-m)).

Durometer—Shore A Test Method: Measured per ASTM method D2240 using an Instron Shore-A type durometer with an automatic operating stand Model 902. Test samples were cured using a chase placed in a hot press preheated to 100° C. and cured for 1 hour. Samples were plied per test standard to achieve thickness required. Test was conducted at 23° C. and 50% relative humidity (RH). Durometer values are measured in Shore A units.

Gas Chromatography (GC) Test Method 1: Used for quantitating SiH groups in organosiloxane test samples. Instrument: a gas chromatogram equipped with a thermal conductivity detector, 150° C.; a 30 meters (m)×0.32 millimeter (mm)×25 micrometer (μm) film of Si molecular sieve; oven at 40° C., inlet at 140° C., 10:1 split; injection volume 0.5 mL; carrier gas nitrogen gas at 1.5 mL per minute flow rate and velocity of 32 centimeters per second (cm/s). Evolve hydrogen gas from a test sample in a butyl rubber septum-capped vial by contacting the test sample in the vial with a solution of potassium hydroxide (KOH) in ethanol for 1 hour with agitation and slight heating. The evolved hydrogen gas is trapped in the headspace of the capped vial. Using a gastight syringe, withdraw 0.5 milliliters (mL) of headspace from the vial and inject it into the GC. External standards are made by diluting a SiH-functional silicone with a 200 polydimethylsiloxane fluid to desired calibration levels, and the standards are treated to generate hydrogen gas as before.

Tensile Properties (Elongation-at-break, tensile modulus, and tensile strength) Test Method: Measured per ASTM standard D412 using an Instron tensiometer Model 5566. Specimens were molded directly into ASTM D412C dog-bone shapes using a chase placed in a hot press preheated to 100° C. and cured for 1 hour. Specimens were pulled at a speed of 2 inches per minute to failure. Elongation at break and stress at break (also known as tensile strength), and modulus at 20% elongation were reported. Values given are an average of five specimens tested for each composition.

Dynamic Viscosity at 25° C. Test Method: Dynamic viscosities of the radical-curable branched polyorganosiloxanes of formula (I) and uncured compositions were measured with a Brookfield DV-III programmable rheometer using standard spindle #52 and isothermal water circulation set at 25° C.

So that those skilled in the art can understand and appreciate the invention taught herein, the following examples are presented, it being understood that these examples should not be used to limit the scope of this invention found in the claims attached hereto. All parts and percentages in the examples are on a weight basis and all measurements were obtained at 25° C., unless indicated to the contrary.

EXAMPLES

Several structures were synthesized to provide examples to support the description of the utility of the curable silicone composition. Seven different inventive radical-curable branched polyorganosiloxanes (I) with varying structures meeting the disclosed structure given herein for the radical-curable branched polyorganosiloxane of constituent (I) were synthesized and are referred to as Polymers 1 to 7 (or for short, "Pol1" to "Pol7"). For comparison, two other structures generally known in the art were also synthesized. Comparative Polymer A is a linear polyorganosiloxane with methacrylate functionality at the terminal ends. Comparative Polymer B is a linear polyorganosiloxane with clustered methacrylate functionality at the terminal ends as disclosed in patent WO 2014124364. The number of reactive groups in a given weight of Polymers 1 to 7 or Comparative Polymer A or B varied and was not consistent. We added extra methacrylated cyclics to compositions that had lesser wt % methacrylate functionality so that the methacrylate content would be the same for all compositions when comparisons are made. Compensating for these differences in weight % of reactive sites in different ones of the Polymers 1 to 7 and Comparative Polymers A and B results in better comparison of impact of polymer structure of constituent (I) on cure speed and physical properties of the examples of the curable silicone composition containing it. To enable this compensation and also to demonstrate the utility of silicone reactive diluent constituent (III), three different structures of silicone reactive diluents were also synthesized, and are referred to herein as Dil1, Dil2, and Dil3. The silicone reactive diluents (III) were then blended with different ones of the Polymers 1 to 7 and Comparative Polymers A and B to obtain examples disclosed in this section. These blends were prepared such that the resulting overall weight % of methacrylate functionality in the curable silicone composition would be equivalent for all examples.

Preparation 1: Preparation of Reactive diluent, Diluent 1 (Dil1) was prepared by slow addition of a mixture of 94 mmol of tetramethylcyclotetrasiloxane and 43 mmol of pentamethylcyclopentasiloxane to a mixture of 700 mmol of allyl methacrylate, 285 ppm butylated hydroxytoluene, and 5 ppm platinum as a catalyst, maintaining a reaction temperature of 60° C. or less. Addition was carried out over the course of 20 minutes, followed by mixing for 72 hours to give Dil1 having the formula $(R^2R^1SiO_{2/2})_{4.2}$, wherein $R^1$ is $CH_3$ and $R^2$ is $-(CH_2)_3O_2CC(CH_3)=CH_2$. The final material was found to contain less than 5 ppm SiH by GC.

Preparation 2: Preparation of Reactive diluent, Diluent 2 (Dil2) used in Examples 5 and 6, was prepared similarly to Polymer 1 of Example 1, where the starting polymer was $[Si(CH_3)_2O]_{150}[Si(CH=CH_2)CH_3O]_3[Si(CH=CH_2)(CH_3)_2O_{1/2}]_2$. Dil2 has formula $(R^1{}_2SiO)_{150}(R^2R^1SiO)_3(R^2R^1{}_2SiO_{1/2})_2(R^3)_5$, wherein $R^1$ is $CH_3$, $R^2$ is $-Si(CH_3)_2-O-Si(CH_3)_2-(CH_2)_3O_2CC(CH_3)=CH_2$ and $R^3$ is $CH_2CH_2$.

Preparation 3: Preparation of Diluent 3 (Dil3) used in Example 3 was prepared in situ with Polymer 6 of Example 6, where preparation method is already described. Dil3 has formula $(R^1{}_2SiO)_{100}(R^2R^1{}_2SiO_{1/2})_2$, wherein $R^1$ is $CH_3$ and $R^2$ is $-(CH_2)_3O_2CC(CH_3)=CH_2$.

Preparation 4: Preparation of reactive species 7-b': $H-Si(CH_3)_2-O-Si(CH_3)_2-(CH_2)_3O_2CC(CH_3)=CH_2$. In order to prepare Polymer 7 of Example 7, a reactive species 7-b', more specifically an SiH functional and methacrylate-functional molecule, $H-Si(CH_3)_2-O-Si(CH_3)_2-(CH_2)_3O_2CC(CH_3)=CH_2$, was prepared first. A mixture of 0.93 moles of tetramethyldisiloxane and 7 ppm platinum as a catalyst was prepared and heated to 50° C. To this was added dropwise a mixture of 0.22 moles allyl methacrylate and 290 ppm butylated hydroxytoluene as an inhibitor over the course of 50 minutes. The mixture was then stripped to a pressure of less than 10 Torr (1.3 kilopascals (kPa)) at a temperature of 50° C. over the course of 80 minutes in order to remove excess tetramethyldisiloxane. To this final product was added 215 ppm diallyl maleate as a stabilizer. The final product was confirmed to be $H-Si(CH_3)_2-O-Si(CH_3)_2-(CH_2)_3O_2CC(CH_3)=CH_2$ by $^1H$ NMR, taking a ratio of the peak at about 4.15 ppm, which corresponds to $H-Si(CH_3)_2-O-Si(CH_3)_2-(CH_2)_3O_2CC(CH_3)=CH_2$, and the peak at about 3.45 ppm, which corresponds to $H-Si(CH_3)_2-O-Si(CH_3)_2-CH_2CH_2CH_2O_2CC(CH_3)=CH_2$.

This invention includes intermediates used in the synthesis of the radical-curable branched polyorganosiloxane (I) and new constituents used in the formulation of the curable silicone composition. Examples of this invention includes Dil1, Dil2, Dil3, and reactive species 7-b'.

Structures of constituents used for examples are given in table below:

| Example | Structures For Constituents I and III |
|---|---|
| E1a: Pol1 + Dil1 | $(SiO_{4/2})_1(R^1{}_2SiO_{2/2})_{150}(R^2R^1{}_2SiO_{1/2})_{3.4}(R^1{}_3SiO_{1/2})_{0.6}(R^3)_{3.4}$ + $(R^2R^1SiO_{2/2})_{4.2}$ |
| E2a: Pol2 + Dil1 | $(SiO_{4/2})_1(R^1{}_2SiO)_{400}(R^2R^1{}_2SiO_{1/2})_{3.5}(R^1{}_3SiO_{1/2})_{0.5}(R^3)_{3.5}$ + $(R^2R^1SiO_{2/2})_{4.2}$ |
| E3a: Pol3 + Dil1 | $(SiO_{4/2})_1(R^1{}_2SiO_{2/2})_{600}(R^2R^1{}_2SiO_{1/2})_3(R^1{}_3SiO_{1/2})_1(R^3)_3$ + $(R^2R^1SiO_{2/2})_{4.2}$ |
| E4a: Pol4 + Dil1 | $(SiO_{4/2})_1(R^1{}_2SiO_{2/2})_{1000}(R^2R^1{}_2SiO_{1/2})_4(R^3)_4$ + $(R^2R^1SiO_{2/2})_{4.2}$ |
| E5a: Pol5 + Dil1 + Dil2 | $(R^1SiO_{3/2})_{0.8}(R^1{}_2SiO_{2/2})_{500}(R^2R^1{}_2SiO_{1/2})_{2.4}(R^3)_{2.4}$ + $(R^2R^1SiO_{2/2})_{4.2}$ + $(R^1{}_2SiO_{2/2})_{150}(R^2R^1SiO_{2/2})_3(R^2R^1{}_2SiO_{1/2})_2(R^3)_5$ |
| E6a: Pol1 + Dil2 | $(SiO_{4/2})_1(R^1{}_2SiO_{2/2})_{150}(R^2R^1{}_2SiO_{1/2})_{3.4}(R^1{}_3SiO_{1/2})_{0.6}(R^3)_3$ + $(R^1{}_2SiO_{2/2})_{150}(R^2R^1SiO_{2/2})_3(R^2R^1{}_2SiO_{1/2})_2(R^3)_5$ |
| E7a: Pol6 + Dil3 + Dil1 | $(SiO_{4/2})_1(R^1{}_2SiO_{2/2})_{500}(R^2R^1{}_2SiO_{1/2})_{3.4}(R^1{}_3SiO_{1/2})_{0.6}(R^3)_{3.4}$ + $(R^1{}_2SiO_{2/2})_{100}(R^2R^1{}_2SiO_{1/2})_2$ + $(R^2R^1SiO_{2/2})_{4.2}$ |

-continued

| | Structures For Constituents I and III |
|---|---|
| E8a: Pol7 + Dil1 Comparative Ex. | $(SiO_{4/2})_1(R^1{}_2SiO_{2/2})_{150}(R^2R^1{}_2SiO_{1/2})_3(R^1{}_3SiO_{1/2})_1(R^3)_3 + (R^2R^1SiO_{2/2})_{4.2}$ |
| CE1a: PolA + Dil1 | $(R^1{}_2SiO_{2/2})_{500}(R^2R^1{}_2SiO_{1/2})_2(R^3)_2 + (R^2R^1SiO_{2/2})_{4.2}$ |
| CE2a: PolB + Dil1 + Dil3 | $(R^1{}_2SiO_{2/2})_{500}(R^2R^1SiO_{2/2})_{6.4}(R^1{}_3SiO_{1/2})_{2(R}{}^3)_2 + (R^2R^1SiO_{2/2})_{4.2} + (R^1{}_2SiO_{2/2})_{100}(R^2R^1{}_2SiO_{1/2})_2$ |

In all examples in the above table, Dil means diluent and Pol means polymer, $R^1$ is either a methyl group or a monovalent organic group that cannot be reacted via radical cure; $R^2$ is a propyl methacrylate group; $R^3$ is either an ethylene linking group or other divalent hydrocarbon group. All examples were designed such that the total of constituents (I) and (III) would contain an equal target overall weight % methacrylate.

Methods used to make example structures and overall weight % diluent used for examples are given in table below:

| Example | Method for Synthesis | % Dil (III) |
|---|---|---|
| E1a: Pol1 + Dil1 | (I) and (III) by 1st embodiment | 2.4 |
| E2a: Pol2 + Dil1 | (I) and (III) by 1st embodiment | 5.7 |
| E3a: Pol3 + Dil1 | (I) and (III) by 1st embodiment | 6.5 |
| E4a: Pol4 + Dil1 | (I) and (III) by 1st embodiment | 7.0 |
| E5a: Pol5 + Dil1 & Dil2 | (I) and (III) by 1st embodiment | 4.4 & 28.7 |
| E6a: Pol1 + Dil2 | (I) and (III) by 1st embodiment | 99.0 |
| E7a: Pol6 w + Dil3 & Dil1 | (I)&(III) combined and (III) by 1st embodiment | 20.0* & 4.1 |
| E8a: Pol7 + Dil1 | (I) by 2nd embodiment, (III) by 1st embodiment | 2.0 |

| Comparative Ex. | Process for Synthesis | % Dil (III) |
|---|---|---|
| CE1a: PolA + Dil1 | Linear structure w (III) by 1st embodiment | 7.0 |
| CE2a: PolB-w + Dil1 & Dil3 | Dumbbell structure w (III) by 1st embodiment | 1.3* & 34.0 |

*approximate value

Example 1: Preparation of Polymer 1 (Pol1)

In order to prepare the acrylate-functional branched polyorganosiloxane, Polymer 1 used in Example 1, a blend consisting of 9 millimoles (mmol) of $[SiO_{4/2}]_1[Si(CH_3)_2O]_{150}[SiR(CH_3)_2O_{1/2}]_4$ where R is a blend of approximately 85 mol % vinyl (—CH=CH$_2$) and 15 mol % methyl (—CH$_3$), and 48 mmol of tetramethyldisiloxane, with 10 ppm platinum as catalyst was prepared. The molar ratio of 9/48 was set to allow an excess of tetramethyldisiloxane, hence minimizing any chain extension in order to obtain the desired capping reaction. This blend was heated to a temperature of 50° C. and mixed for 30 minutes to allow the hydrosilylation reaction to complete, followed by stripping at 80° C. and less than 10 Torr pressure (1.3 kPa) for 1 hour. To the resultant residual SiH-functional material were added 100 ppm butylated hydroxytoluene, 100 ppm methyltriacetoxysilane and 100 ppm ethyltriacetoxysilane (both from DOW CORNING® ETS 900), and 4.3 mmol of allyl methacrylate. This mixture was heated to 90° C. and mixed for 2 hours, and the reaction was confirmed to be complete via the disappearance of the SiH peak in the FT-IR spectrum (about 2160 cm$^{-1}$) into the background noise of the FT-IR spectra, which were acquired using 32 scans each. Excess allyl methacrylate was then removed via stripping at 90° C. and less than 5 Torr pressure (0.67 kPa) for 0.5 hour to give an example of the radical-curable branched polyorganosiloxane (I) as Pol1, which is of the following formula: $(SiO_{4/2})_1(R^1{}_2SiO)_{150}(R^2R^1{}_2SiO_{1/2})_{3.4}(R^1{}_3SiO_{1/2})_{0.6}(R^3)_{3.4}$, wherein $R^1$ is $CH_3$, $R^2$ is —Si(CH$_3$)$_2$—O—Si(CH$_3$)$_2$—(CH$_2$)$_3$O$_2$CC(CH$_3$)=CH$_2$ and $R^3$ is CH$_2$CH$_2$. The final material was found to contain less than 0.3 ppm SiH by gas chromatography (GC) according to GC Test Method 1.

Example 1a

Pol1 of Example 1 was blended with Dil1 to give the blend of Example 1a.

Example 2: Preparation of Polymer 2 (Pol2)

Polymer 2 used in Example 2 was prepared similarly to Polymer 1 of Example 1, except where the starting polymer was $[SiO_{4/2}]_1[Si(CH_3)_2O]_{400}[SiR(CH_3)_2O_{1/2}]_4$, where R is a blend of approximately 88.5 mol % vinyl (—CH=CH$_2$) and 12.5 mol % methyl (—CH$_3$) to give an example of the radical-curable branched polyorganosiloxane (I) as Pol2, which is of the following formula: $(SiO_{4/2})_1(R^1{}_2SiO)_{400}(R^2R^1{}_2SiO_{1/2})_{3.5}(R^1{}_3SiO_{1/2})_{0.5}(R^3)_{3.5}$, wherein $R^1$ is CH$_3$, $R^2$ is —Si(CH$_3$)$_2$—O—Si(CH$_3$)$_2$—(CH$_2$)$_3$O$_2$CC(CH$_3$)=CH$_2$ and $R^3$ is CH$_2$CH$_2$.

Example 2a

Pol2 of Example 2 was blended with Dil1 to give the blend of Example 2a.

Example 3: Preparation of Polymer 3 (Pol3)

Polymer 3 of Example 3 was prepared similarly to Polymer 1 of Example 1, except where the starting polymer was $[SiO_{4/2}]_1[Si(CH_3)_2O]_{600}[SiR(CH_3)_2O_{1/2}]_4$, where R is a blend of approximately 75 mol % vinyl (—CH=CH$_2$) and 25 mol % methyl (—CH$_3$) to give an example of the radical-curable branched polyorganosiloxane (I) as Pol3, which is of the following formula: $(SiO_{4/2})_1(R^1{}_2SiO)_{600}(R^2R^1{}_2SiO_{1/2})_3(R^1{}_3SiO_{1/2})_1(R^3)_3$, wherein $R^1$ is CH$_3$, $R^2$ is —Si(CH$_3$)$_2$—O—Si(CH$_3$)$_2$—(CH$_2$)$_3$O$_2$CC(CH$_3$)=CH$_2$ and $R^3$ is CH$_2$CH$_2$.

Example 3a

Pol3 of Example 3 was blended with Dil1 to give the blend of Example 3a.

Example 4: Preparation of Polymer 4 (Pol4)

Polymer 4 of Example 4 was prepared similarly to Polymer 1 of Example 1, except where the starting polymer was $[SiO_{4/2}]_1[Si(CH_3)_2O]_{1000}[SiR(CH_3)_2O_{1/2}]_4$, where R is approximately 100 mol % vinyl (—CH=CH$_2$) to give an example of the radical-curable branched polyorganosiloxane (I) as Pol4, which is of the following formula: (SiO$_{4/2}$)$_1$(R$^1_2$SiO)$_{1000}$(R$^2$R$^1_2$SiO$_{1/2}$)$_4$(R$^3$)$_4$, wherein R$^1$ is CH$_3$, R$^2$ is —Si(CH$_3$)$_2$—O—Si(CH$_3$)$_2$—(CH$_2$)$_3$O$_2$CC(CH$_3$)=CH$_2$ and R$^3$ is CH$_2$CH$_2$.

Example 4a

Pol4 of Example 4 was blended with Dil1 to give the blend of Example 4a.

Example 5: Preparation of Polymer 5 (Pol5)

Polymer 5 of Example 5 was prepared similarly to Polymer 1 of Example 1, except where the starting polymer was [SiCH$_3$O$_{3/2}$]$_{0.8}$[Si(CH$_3$)$_2$O]$_{500}$[SiR(CH$_3$)$_2$O$_{1/2}$]$_{2.4}$, where R is approximately 100 mol % vinyl (—CH=CH$_2$) to give an example of the radical-curable branched polyorganosiloxane (I) as Pol5, which is of the following formula: (SiO$_{4/2}$)$_{0.8}$(R$^1_2$SiO)$_{500}$(R$^2$R$^1_2$SiO$_{1/2}$)$_{2.4}$(R$^3$)$_{2.4}$, wherein R$^1$ is CH$_3$, R$^2$ is —Si(CH$_3$)$_2$—O—Si(CH$_3$)$_2$—(CH$_2$)$_3$O$_2$CC(CH$_3$)=CH$_2$ and R$^3$ is CH$_2$CH$_2$.

Example 5a

Pol5 of Example 5 was blended with Dil1 and Dil2 to give the blend of Example 5a.

Example 6: Preparation of Polymer 6 (Pol6)

Polymer 6 used in Example 6 was prepared in the presence of Diluent 3. A mixture of acrylate-functional branched siloxane polymer and acrylate-functional linear siloxane polymer was prepared by mixing 9 mmol of [SiO$_{4/2}$]$_1$[Si(CH$_3$)$_2$O]$_{150}$[SiR(CH$_3$)$_2$O$_{1/2}$]$_4$ where R is a blend of approximately 85 mol % vinyl (—CH=CH$_2$) and 15 mol % methyl (—CH$_3$), 78 mmol of [Si(CH$_3$)$_2$O]$_{100}$[SiH(CH$_3$)$_2$O$_{1/2}$]$_2$, and 150 mmol of allyl methacrylate, with 200 ppm butylated hydroxytoluene, 75 ppm methyltriacetoxysilane and 75 ppm ethyltriacetoxysilane (both from DOW CORNING® ETS 900), and 3 ppm platinum as a catalyst. This mixture was heated to a temperature of 80° C. and mixed for 30 minutes, followed by removal of excess allyl methacrylate and volatiles at 90° C. and less than 100 Torr pressure (13 kPa) for 1 hour to give an example of the radical-curable branched polyorganosiloxane (I) as Pol6, which is of the following formula: (SiO$_{4/2}$)$_1$(R$^1_2$SiO)$_{500}$(R$^2$R$^1_2$SiO$_{1/2}$)$_{3.4}$(R$^1_3$SiO$_{1/2}$)$_{0.6}$(R$^3$)$_3$, wherein R$^1$ is CH$_3$, R$^2$ is —Si(CH$_3$)$_2$—O—Si(CH$_3$)$_2$—(CH$_2$)$_3$O$_2$CC(CH$_3$)=CH$_2$ and R$^3$ is CH$_2$CH$_2$. The final material was found to contain less than 0.1 ppm SiH by GC.

Example 6a

Pol6 of Example 6 was blended with Dil2 to give the blend of Example 6a.

Example 7: Preparation of Polymer 7 (Pol7)

The acrylate-functional branched siloxane Polymer 7 was then prepared by mixing 9 mmol of [SiO$_{4/2}$]$_1$[Si(CH$_3$)$_2$O]$_{150}$[SiR(CH$_3$)$_2$O$_{1/2}$]$_4$ where R is a blend of approximately 85 mol % vinyl (—CH=CH$_2$) and 15 mol % methyl (—CH$_3$), and 33 mmol of the H—Si(CH$_3$)$_2$—O—Si(CH$_3$)$_2$—(CH$_2$)$_3$O$_2$CC(CH$_3$)=CH$_2$ prepared as described above for reactive species 7-b', with 100 ppm methyltriacetoxysilane and 100 ppm ethyltriacetoxysilane (both from DOW CORNING® ETS 900), and 6 ppm platinum as a catalyst. The resulting mixture was heated to a temperature of 60° C. and held for 1 hour, followed by stripping at 60° C. and less than 10 Torr pressure (1.3 kPa) for 2.5 hours to give an example of the radical-curable branched polyorganosiloxane (I) as Pol7, which is of the following formula: (SiO$_{4/2}$)$_1$(R$^1_2$SiO)$_{150}$(R$^2$R$^1_2$SiO$_{1/2}$)$_3$(R$^1_3$SiO$_{1/2}$)$_1$(R$^3$)$_3$, wherein R$^1$ is CH$_3$, R$^2$ is —Si(CH$_3$)$_2$—O—Si(CH$_3$)$_2$—(CH$_2$)$_3$O$_2$CC(CH$_3$)=CH$_2$ and R$^3$ is CH$_2$CH$_2$. The reaction was confirmed to be complete via the disappearance of the SiH peak in the IR spectrum (about 2160 cm$^{-1}$) into the spectrum background. The final material was found to contain less than 0.3 ppm SiH by GC.

Example 7a

Pol6 of Example 6 was blended with Dil1 and Dil3 to give the blend of Example 7a.

Example 8a

Pol7 of Example 7 was blended with Dil1 to give the blend of Example 7a.

Comparative Example (CE) 1a

Preparation of Comparative Polymer A of CE 1 was prepared similarly to Polymer 1 of Example 1, except where the starting polymer was [Si(CH$_3$)$_2$O]$_{500}$[SiR(CH$_3$)$_2$O$_{1/2}$]$_2$, where R is approximately 100 mol % vinyl (—CH=CH$_2$). Comparative Polymer A is of the following formula: (R$^1_2$SiO)$_{500}$(R$^2$R$^1_2$SiO$_{1/2}$)$_2$(R$^3$)$_2$, wherein R$^1$ is CH$_3$, R$^2$ is —Si(CH$_3$)$_2$—O—Si(CH$_3$)$_2$—(CH$_2$)$_3$O$_2$CC(CH$_3$)=CH$_2$ and R$^3$ is CH$_2$CH$_2$. Comparative Polymer A was blended with Dil1 to give the blend of CE 1a.

Comparative Example (CE) 2a

Preparation of Comparative Polymer B of CE2 was prepared in accordance with method described in WO 2014124364. Comparative Polymer B is of the following formula: (R$^1_2$SiO)$_{500}$(R$^2$R$^1$SiO$_{2/2}$)$_{6.4}$(R$^1_3$SiO$_{1/2}$)$_2$(R$^3$)$_2$, wherein R$^1$ is CH$_3$, R$^2$ is a methacrylate-containing functional group, and R$^3$ is CH$_2$CH$_2$ Comparative Polymer B was blended with Dil1 and Dil3 to give the blend of CE 2a.

Examples of the curable silicone compositions using curable branched polyorganosiloxanes, comparative materials, and silicone reactive diluents described above for each example, were made for testing by blending constituents per recipe given in table below:

| Constituent | Weight % |
| --- | --- |
| Constituents (I) & (III) total | 97.5 |
| Constituent (II) - DCBP | 2.5 | where DCBP is dichlorobenzoyl peroxide.

Examples 1b to 8b and CE1b and CE2b: curable silicone compositions and cured products prepared by curing same. Curable silicone compositions using the radical-curable branched polyorganosiloxanes (I)/reactive diluent blends of Examples 1a to 8a and the blends of competitive examples CE1a and CE2a, respectively, were made per basic recipe given and tested for basic properties such as cure speed and strength to give the curable silicone compositions and cured products of Examples 1b to 8b and CE1b and CE2b, respectively. The compositions were free of fumed silica. Results of testing are given in table below:

| | Composition Viscosity (cP) | Cure Onset Time at 85° C. (minutes) | Durometer (Shore A) | Tensile modulus at 20% (psi) | Tensile strength (psi) | Elongation at break (%) |
|---|---|---|---|---|---|---|
| Ex 1b | 300 | 3.40 | 12 | 22 (150 kPa) | 30 (207 kPa) | 34 |
| Ex 2b | 2,000 | 6.01 | 12 | 9 (62 kPa) | 25 (172 kPa) | 80 |
| Ex 3b | 3,500 | 11.44 | 10 | 5 (34 kPa) | 27 (190 kPa) | 125 |
| Ex 4b | 19,000 | 6.50 | 19 | 12 (82 kPa) | 43 (296 kPa) | 95 |
| Ex 5b | 1,800 | 3.19 | <10 | — | 10 (69 kPa) | 10 |
| Ex 6b | 2,500 | 2.32 | 48 | 60 (410 kPa) | 100 (690 kPa) | 40 |
| Ex 7b | 800 | 4.91 | 20 | 15 (103 kPa) | 34 (234 kPa) | 60 |
| Ex 8b | 300 | 3.89 | 11 | 8 (55 kPa) | 15 (103 kPa) | 26 |
| CEx 1b | 17,000 | 9.01 | 20 | 15 (103 kPa) | 55 (380 kPa) | 115 |
| CEx 2b | 15,000 | 2.67 | 28 | 27 (190 kPa) | 85 (552 kPa) | 80 |

In the above table, test materials (e.g., cured compositions) are characterized by dynamic viscosity reported in centipoise ("Composition Viscosity (cP)"), cure onset time reported in minutes ("Cure Onset Time at 85° C. (minutes)"), Durometer hardness is reported in Shore A units ("Durometer (Shore A)"), tensile modulus at 20% strain reported in pounds per inch (psi) and kilopascals (kPa) ("Tensile modulus at 20% (psi)"), tensile strength reported in pounds per inch (psi) and kilopascals (kPa) ("Tensile strength (psi)"), and elongation-at-break reported in percent ("Elongation at break (%)"). The cure onset time at 85° C. is defined as the length of time (minutes) needed to reach torque of 0.5 lb-in (0.06 Newton-meter (N-m)) using a Moving Die Rheometer (MDR). As the uncured material being tested in the pre-heated MDR begins to crosslink or cure, the torque registered by the machine begins to increase. This increase in torque will typically continue over time until any crosslinking reactions that would occur at the pre-set temperature and would impact the torque reading are complete. The time at which the torque registered by the machine begins to increase and surpass a user-defined value (e.g., 7 minutes) is referred to as the onset of cure. Cure onset time is a measure of how quickly a particular curable silicone composition will begin to cure at a given temperature and is used as a measure for cure speed. Durometer, Tensile, Elongation (DTE) measured on material cured using a heated press; cure conditions: heating 100° C. for 1 hour. Dynamic viscosity and DTE measurements were made at 25° C. The Durometer (Shore A) is a measure of hardness. The higher the Durometer (Shore A) value, the harder is the material (e.g., cured composition). The tensile modulus at 20% is a measure of stiffness. The higher the tensile modulus at 20% value in psi (pounds per square inch), the more stress will be required to deform the material. The tensile strength is a measure of stress at break. The higher the tensile strength value in psi (pounds per square inch), the greater the stress required to break the test material (e.g., cured composition) under tensile deformation. The elongation-at-break (%) is a measure of a ratio between changed length and initial length at the point of breakage of the test material. The higher the elongation-at-break percent value, the greater the capability of the test material (e.g., cured composition) to resist elongation (stretching) without breaking.

Embodiments of the curable silicone compositions that have faster cure but have less than optimal physical properties, and curable silicone compositions that have adequate physical properties (e.g., non-brittle, mechanical strength, or elongation-at-break) but are slower to cure, are contemplated. In some aspects the curable silicone compositions have an optimal combination of properties for a formulated product such as faster cure and adequate physical properties (non-brittle nature). Adequate cure speed is defined as having a cure onset time of <7 minutes and a non-brittle nature is defined as having an elongation-at-break of >25%. Meeting these target properties will allow aspects of the curable silicone composition to be readily formulated with, for example, reinforcing filler, thermally conductive filler, or other constituents to yield a formulated product that would have utility for a number of applications. Embodiments of the curable silicone composition having other combinations of cure onset speed and physical properties are contemplated and may be useful in other applications. Comparative Example 1b meets the strength criteria, but as we expected for a simple long linear polymer, does not meet the cure speed criterion. Examples 1b, 2b, 4b, 6b, 7b, and 8b are of optimal utility for making a formulated product having one or more additional constituents.

As demonstrated in above examples, (radical-)curable silicone compositions using radical-curable branched polyorganosiloxanes (I) have been designed to have an optimal combination of properties including fast cure speed, high strength, high elongation (toughness) and/or other criteria desired for various applications. As demonstrated in Examples, the structure of the radical-curable branched polyorganosiloxane (I) and the availability and level of radical-curable functionality thereon have a large impact on properties and may be designed appropriately for the material to have utility in a number of applications.

Certain aspects of the invention are as defined in the following claims. Such claims are incorporated here by reference as numbered aspects, and the word "claim" is changed to "aspect."

What is claimed is:
1. A radical-curable branched polyorganosiloxane of formula:

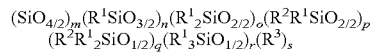

wherein:
each $R^1$ is independently a monovalent organic group free of aliphatic unsaturation;
each $R^2$ is independently a radical-curable group;
each $R^3$ is independently an alkylene having 2 to 12 carbon atoms;
subscript m is 1;
subscript n is 0;
subscript o is from 100 to 1100;
subscript p is 0;
subscript q is from 2.9 to 4;

and
subscript r is from 0 to 1.1;
with the proviso that the sum of subscripts q+r=n+2m+2;
subscript s is from 2 to 6;
and
wherein the branched polyorganosiloxane has, on average, at least 2 radical-curable groups (i.e. $R^2$) per molecule.

2. The branched polyorganosiloxane of claim 1, wherein each radical-curable group is independently a monovalent organic group containing an acrylate group, a methacrylate group, or a combination thereof.

3. The branched polyorganosiloxane of claim 1 that is a reaction product of a reaction of constituents comprising:
(a) a branched polyorganosiloxane having, on average, greater than two silicon bonded hydrogen atoms per molecule; and
(b) a reactive species having, per molecule, at least one aliphatically unsaturated organic group and one or more radical-curable groups selected from acrylate groups and methacrylate groups;
in the presence of
(c) a hydrosilylation catalyst.

4. The branched polyorganosiloxane of claim 1 that is a reaction product of a reaction of constituents comprising:
(a') a branched polyorganosiloxane having, on average, greater than two aliphatically unsaturated groups per molecule; and
(b') a reactive species having, per molecule, at least one silicon-bonded hydrogen and one or more radical-curable groups selected from acrylate groups and methacrylate groups,
in the presence of
(c) a hydrosilylation catalyst.

5. A curable silicone composition comprising:
(I) a radical-curable branched polyorganosiloxane of formula:

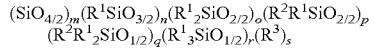

wherein
each $R^1$ is independently a monovalent organic group free of aliphatic unsaturation;
each $R^2$ is independently a radical-curable group;
each $R^3$ is independently an alkylene having 2 to 12 carbon atoms;
subscript m is 1;
subscript n is 0;
subscript o is from 100 to 1100;
subscript p is 0;
subscript q is from 2.9 to 4;
subscript r is from 0 to 1.1;
with the proviso that the sum of subscripts q+r=n+2m+2;
subscript s is from 2 to 6;
wherein the radical-curable branched polyorganosiloxane (I) has, on average, at least 2 radical-curable groups per molecule; and
(II) a radical initiator.

6. The curable silicone composition of claim 5 wherein $R^2$ is a monovalent organic group containing an acrylate group, a methacrylate group, or a combination thereof.

7. The curable silicone composition of claim 5, wherein the radical-curable branched polyorganosiloxane (I) comprises a reaction product of a reaction of constituents comprising:

(a) a branched polyorganosiloxane having, on average, greater than two silicon bonded hydrogen atoms per molecule; and
(b) a reactive species having, per molecule, at least one aliphatically unsaturated organic group and one or more radical-curable groups selected from acrylate groups and methacrylate groups;
in the presence of
(c) a hydrosilylation catalyst.

8. The curable silicone composition of claim 7 wherein constituent (a) comprises a reaction product of a reaction of constituents comprising:
(a1) a branched polyorganosiloxane having on average, per molecule, greater than two aliphatically unsaturated groups; with
(a2) a polyorganosiloxane having two silicon bonded hydrogen atoms;
in the presence of
(c) a hydrosilation catalyst.

9. The curable silicone composition of claim 5, wherein the radical-curable branched polyorganosiloxane (I) comprises a reaction product of a reaction of constituents comprising:
(a') a branched polyorganosiloxane having, on average, greater than two aliphatically unsaturated groups per molecule; and
(b') a reactive species having, per molecule, at least one silicon-bonded hydrogen and one or more radical-curable groups selected from acrylate groups and methacrylate groups, in the presence of
(c) a hydrosilylation catalyst.

10. The curable silicone composition of claim 9 wherein the reactive species (b') is of formula: $R^5_jSiR^2_kR^1_{(4-j-k)}$, wherein
each of subscripts j and k independently is from 1 to 3 with the proviso that the sum of subscripts (j+k) is less than or equal to 4;
each $R^5$ is independently a hydrogen atom or a monovalent organosilicon group containing a silicon bonded hydrogen atom;
each $R^2$ is independently a radical-curable group; and
each $R^1$ is independently a monovalent organic group free of aliphatic unsaturation.

11. The curable silicone composition of claim 5 further comprising (IV) a filler; (V) a filler treating agent; or both (IV) and (V).

12. The curable silicone composition of claim 5 further comprising (VI) a moisture cure initiator and (VII) a crosslinker.

13. A method for making a cured article, the method comprising applying the curable silicone composition of claim 5 to a substrate; and curing the applied curable silicone composition onto the substrate.

14. A cured product of curing the curable silicone composition of claim 5.

15. An electronic device comprising the cured product of claim 14 and at least one other device component in operative contact therewith.

16. A manufactured article comprising a substrate and a sealant disposed in sealing operative contact thereon, the sealant comprising the cured product of claim 14.

17. A manufactured article comprising an assembly comprising first and second substrates and an adhesive disposed in adhering operative contact therebetween, the adhesive comprising the cured product of claim 14.

18. A device comprising a thermally conductive member and at least one other component in thermal communication therewith, the thermally conductive member comprising the cured product of claim 14.

* * * * *